(12) United States Patent
Kim et al.

(10) Patent No.: US 11,937,455 B2
(45) Date of Patent: Mar. 19, 2024

(54) DISPLAY DEVICE

(71) Applicant: Samsung Display Co., Ltd., Yongin-si (KR)

(72) Inventors: Hye Won Kim, Seoul (KR); Sun Hee Lee, Hwaseong-si (KR); Ju Chan Park, Seoul (KR); Gun Hee Kim, Seoul (KR); Ok-Kyung Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 339 days.

(21) Appl. No.: 17/498,992

(22) Filed: Oct. 12, 2021

(65) Prior Publication Data
US 2022/0208864 A1 Jun. 30, 2022

(30) Foreign Application Priority Data

Dec. 28, 2020 (KR) .......................... 10-2020-0185151

(51) Int. Cl.
*H10K 59/121* (2023.01)
*G09G 3/3225* (2016.01)
*H10K 50/80* (2023.01)
*H10K 59/131* (2023.01)
(Continued)

(52) U.S. Cl.
CPC ......... *H10K 59/121* (2023.02); *G09G 3/3225* (2013.01); *H10K 50/80* (2023.02); *H10K 59/131* (2023.02); *H10K 77/111* (2023.02); *H10K 2102/311* (2023.02)

(58) Field of Classification Search
CPC .... H10K 59/121; H10K 50/80; H10K 59/131; H10K 77/111; H10K 2102/311; H10K 59/353; G09G 3/3225; G09G 2300/0426; G09G 3/035; G09G 2300/0876; G09G 2310/0232; G09G 2310/0251; G09G 3/3241; G09G 2380/02; G09G 3/32; H01L 27/1214; H01L 27/156
See application file for complete search history.

(56) References Cited

U.S. PATENT DOCUMENTS 9,184,180 B2  11/2015 Huh et al.
10,411,204 B2  9/2019 Li et al.
10,468,475 B2  11/2019 Cai
(Continued)

FOREIGN PATENT DOCUMENTS

KR  10-1878189  7/2018
KR  10-2113176  5/2020
KR  20220006682  1/2022

*Primary Examiner* — J. E. Schoenholtz
(74) *Attorney, Agent, or Firm* — H.C. Park & Associates, PLC

(57) ABSTRACT

A display device includes a substrate having a first main display area, a second main display area, and a sub-display area positioned between the first main display area and the second main display area; a first driving circuit positioned on the sub-display area of the substrate; a first sub-pixel circuit and a second sub-pixel circuit positioned on respective sides of the first driving circuit in the sub-display area of the substrate; a first sub-light-emitting device connected to the first sub-pixel circuit and overlapping the first driving circuit; and a second sub-light-emitting device connected to the second sub-pixel circuit and overlapping the first driving circuit.

20 Claims, 18 Drawing Sheets

(51) Int. Cl.
 *H10K 77/10* (2023.01)
 *H10K 102/00* (2023.01)

(56) References Cited

U.S. PATENT DOCUMENTS

| | | |
|---|---|---|
| 10,614,735 B2 | 4/2020 | Zeng |
| 2015/0021631 A1 | 1/2015 | Huh et al. |
| 2019/0140025 A1 | 5/2019 | Wang |
| 2022/0013611 A1 | 1/2022 | Park et al. |
| 2022/0189396 A1* | 6/2022 | Cai .................. G09G 3/035 |
| 2022/0343862 A1* | 10/2022 | Cheng ............... H10K 59/1213 |
| 2023/0025386 A1* | 1/2023 | Sun .................... G09G 3/32 |

* cited by examiner

DISPLAY DEVICE

CROSS-REFERENCE TO RELATED APPLICATION

This application claims priority from and the benefit of Korean Patent Application No. 10-2020-0185151, filed on Dec. 28, 2020, which is hereby incorporated by reference for all purposes as if fully set forth herein.

BACKGROUND

Field

Embodiments of the invention relate generally to a display device.

Discussion of the Background

A display device represents a device for displaying images on a screen, and it may be a liquid crystal display (LCD) and an organic light emitting diode (OLED). The display device used in various electronic devices such as portable phones, GPS, digital cameras, electronic books, portable game devices, or various terminals.

The display device may include a display area for displaying images and a peripheral area for displaying no images. A plurality of pixels may be disposed in a row direction and a column direction in the display area. Various elements such as transistors or capacitors and various wires for supplying signals to them may be positioned in the respective pixels. Various wires for transmitting electrical signals for driving the pixels, a scan driver, a data driver, and a controller may be positioned in the peripheral area.

Demands for reducing a size of the peripheral area and increasing the display area are increasing, but an area occupied by the driver increases for a process for realizing high resolution and high-rate driving, so it is difficult to reduce the size of the peripheral area.

The above information disclosed in this Background section is only for understanding of the background of the inventive concepts, and, therefore, it may contain information that does not constitute prior art.

SUMMARY

The described technology has been made in an effort to provide a display device to expand a display area.

Additional features of the inventive concepts will be set forth in the description which follows, and in part will be apparent from the description, or may be learned by practice of the inventive concepts.

An embodiment provides a display device including: a substrate including a first main display area, a second main display area, and a sub-display area positioned between the first main display area and the second main display area; a first driving circuit positioned on the sub-display area of the substrate; a first sub-pixel circuit and a second sub-pixel circuit positioned on respective sides of the first driving circuit on the sub-display area of the substrate; a first sub-light-emitting device connected to the first sub-pixel circuit and overlapping the first driving circuit; and a second sub-light-emitting device connected to the second sub-pixel circuit and overlapping the first driving circuit.

The first sub-pixel circuit may be positioned between the first driving circuit and the first main display area, and the second sub-pixel circuit may be positioned between the first driving circuit and the second main display area.

The display device may further include a second driving circuit and a third driving circuit positioned on the sub-display area of the substrate, wherein the first sub-pixel circuit may be positioned between the first driving circuit and the second driving circuit, and the second sub-pixel circuit may be positioned between the first driving circuit and the third driving circuit.

The first sub-light-emitting device may overlap the first driving circuit or the second driving circuit, and the second sub-light-emitting device may overlap the first driving circuit or the third driving circuit.

The substrate may further include a bendable area, the bendable area may be included in the sub-display area, and the second sub-light-emitting device may overlap the first driving circuit or the bendable area.

The display device may further include: a third sub-pixel circuit and a second driving circuit positioned on the sub-display area of the substrate; and a third sub-light-emitting device connected to the third sub-pixel circuit and overlapping the bendable area or the second driving circuit, wherein the second sub-pixel circuit and the third sub-pixel circuit may be positioned on respective sides of the bendable area, and the third sub-pixel circuit may be positioned between the bendable area and the second driving circuit.

The display device may further include: an insulating layer positioned among a plurality of layers configuring the first driving circuit, the first sub-pixel circuit, and the second sub-pixel circuit and including an opening; and a bendable-portion pattern positioned in the opening, wherein the opening may overlap the bendable area.

The display device may further include: a fourth sub-pixel circuit positioned on the sub-display area of the substrate; and a fourth sub-light-emitting device connected to the fourth sub-pixel circuit and overlapping the second driving circuit, wherein the second driving circuit may be positioned between the third sub-pixel circuit and the fourth sub-pixel circuit.

The first driving circuit may lengthily extend in a first direction, and the bendable area may lengthily extend in a second direction traversing the first direction.

The display device may further include: a third sub-pixel circuit and a fourth sub-pixel circuit positioned on respective sides of the first driving circuit on the sub-display area of the substrate; a third sub-light-emitting device connected to the third sub-pixel circuit and overlapping the first driving circuit or the bendable area; and a fourth sub-light-emitting device connected to the fourth sub-pixel circuit and overlapping the first driving circuit or the bendable area, wherein the bendable area may be positioned between the first sub-pixel circuit and the third sub-pixel circuit and between the second sub-pixel circuit and the fourth sub-pixel circuit, and the first sub-light-emitting device and the second sub-light-emitting device may overlap the first driving circuit or the bendable area.

The display device may further include: a first main pixel circuit positioned on the first main display area of the substrate; a first main light-emitting device connected to the first main pixel circuit and overlapping the first main pixel circuit; a second main pixel circuit positioned on the second main display area of the substrate; and a second main light-emitting device connected to the second main pixel circuit and overlapping the second main pixel circuit.

Another embodiment provides a display device including: a substrate including a first main display area, a second main display area, and a sub-display area positioned between the first main display area and the second main display area and including a bendable area; a first driving circuit positioned on the sub-display area of the substrate; a first sub-pixel circuit positioned between the first driving circuit and the bendable area; and a first sub-light-emitting device connected to the first sub-pixel circuit and overlapping the first driving circuit or the bendable area.

The display device may further include: a second driving circuit positioned on the sub-display area of the substrate; a second sub-pixel circuit positioned between the second driving circuit and the bendable area; and a second sub-light-emitting device not connected to the second sub-pixel circuit and overlapping the second driving circuit or the bendable area.

The display device may further include: a third sub-pixel circuit positioned between the first driving circuit and the first main display area; and a third sub-light-emitting device connected to the third sub-pixel circuit and overlapping the first driving circuit.

The display device may further include: a fourth sub-pixel circuit positioned between the second driving circuit and the second main display area; and a fourth sub-light-emitting device connected to the fourth sub-pixel circuit and overlapping the second driving circuit.

The display device may further include: an insulating layer positioned among a plurality of layers for configuring the first driving circuit and the first sub-pixel circuit, and including an opening; and a bendable-portion pattern positioned in the opening, wherein the opening may overlap the bendable area.

The insulating layer may include an inorganic insulating material, and the bendable-portion pattern may include an organic material.

Another embodiment provides a display device including: a substrate including a first main display area, a second main display area, and a sub-display area positioned between the first main display area and the second main display area and including a first bendable area; a first driving circuit positioned on the sub-display area of the substrate; a first sub-pixel circuit positioned on the sub-display area of the substrate; and a first sub-light-emitting device connected to the first sub-pixel circuit and overlapping the first driving circuit or the first bendable area, wherein the first driving circuit may be positioned between the first sub-pixel circuit and the first bendable area.

The display device may further include: a second driving circuit positioned on the sub-display area of the substrate; a second sub-pixel circuit positioned on the sub-display area of the substrate; and a second sub-light-emitting device connected to the second sub-pixel circuit and overlapping the second driving circuit or the first bendable area, wherein the second driving circuit may be positioned between the second sub-pixel circuit and the first bendable area.

The display device may further include: a second driving circuit and a third driving circuit positioned on the sub-display area of the substrate; a second sub-pixel circuit positioned on the sub-display area of the substrate; and a second sub-light-emitting device connected to the second sub-pixel circuit, wherein the sub-display area may further include a second bendable area, the second driving circuit may be positioned between the first bendable area and the second bendable area, the third driving circuit may be positioned between the second bendable area and the second sub-pixel circuit, the first sub-light-emitting device may overlap at least one of the first driving circuit, the first bendable area, and the second driving circuit, and the second sub-light-emitting device may overlap at least one of the second driving circuit, the second bendable area, and the third driving circuit.

According to the embodiments, the display device with an expanded display area may be provided.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
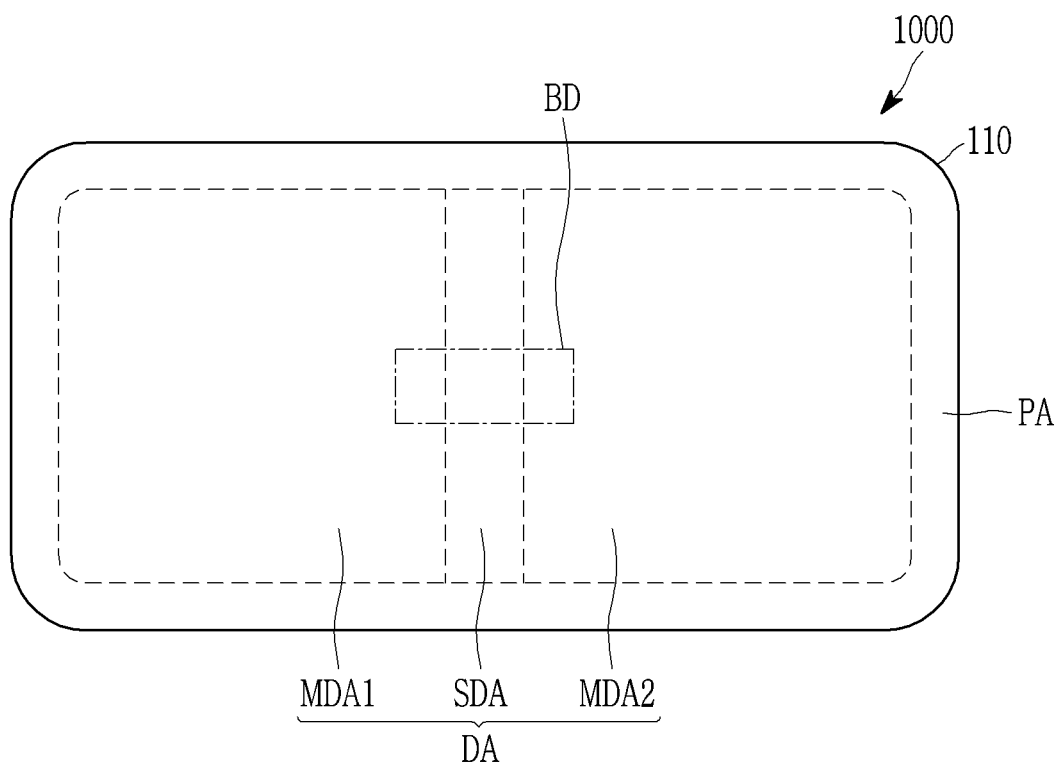
FIG. 1 illustrates a top plan view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the dt1-axis, the dt2-axis, and the dt3-axis are not limited to three axes of a rectangular coordinate system, such as the x, y, and z-axes, and may be interpreted in a broader sense. For example, the dt1-axis, the dt2-axis, and the dt3-axis may be perpendicular to one another, or may represent different directions that are not perpendicular to one another. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The present invention will be described more fully hereinafter with reference to the accompanying drawings, in which embodiments of the invention are illustrated. As those skilled in the art would realize, the described embodiments may be modified in various different ways, all without departing from the spirit or scope of the present invention.

Parts that are irrelevant to the description will be omitted to clearly describe the present invention, and the same elements will be designated by the same reference numerals throughout the specification.

The size and thickness of each configuration illustrated in the drawings are arbitrarily illustrated for better understanding and ease of description, but the present invention is not limited thereto. The thickness of layers, films, panels, regions, etc. are exaggerated for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

A display device according to an embodiment will now be described with reference to FIG. 1 to FIG. 3.

Figure 2:
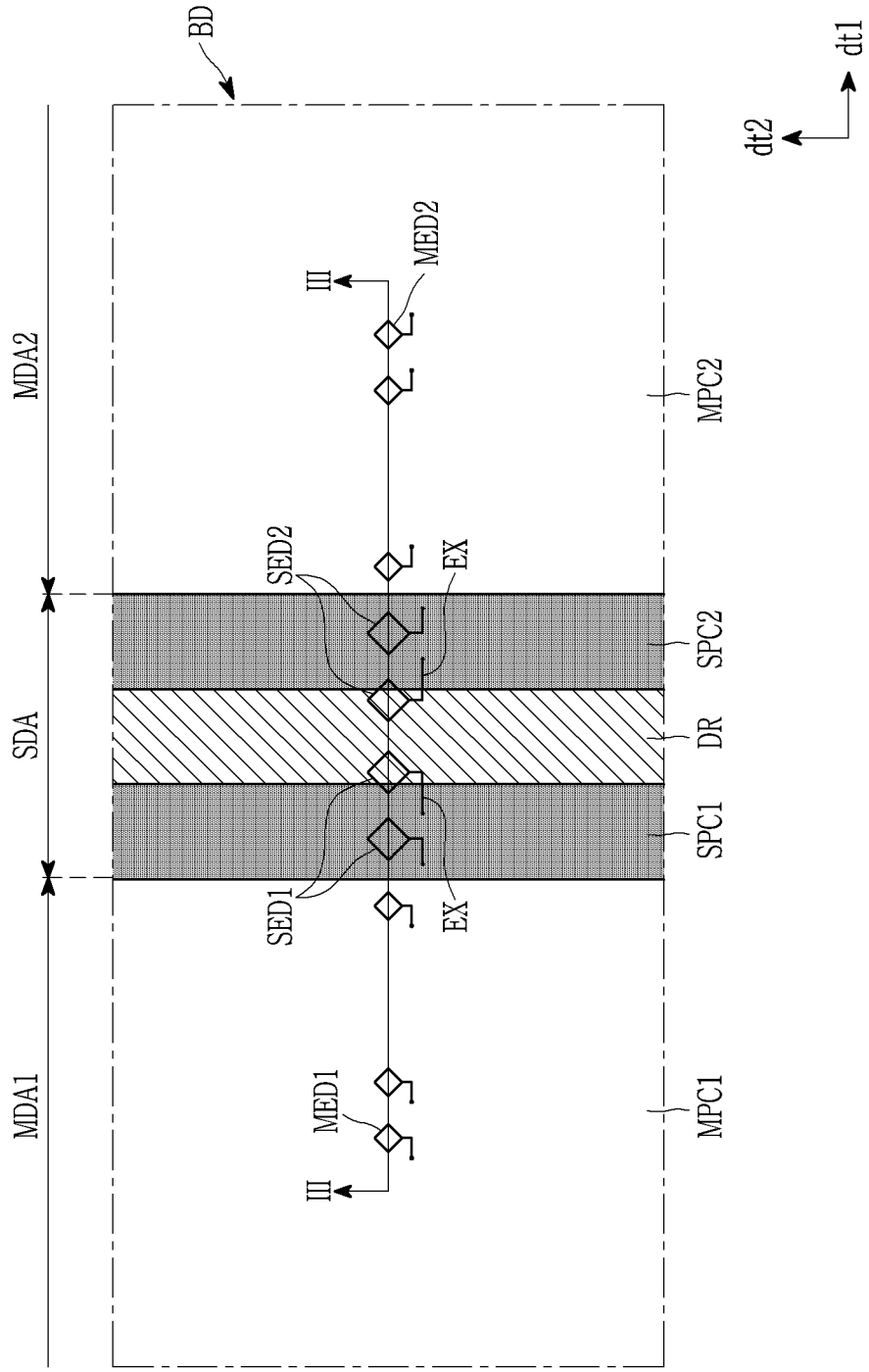
FIG. 2 illustrates an enlarged predetermined region of FIG. 1.
Figure 3:
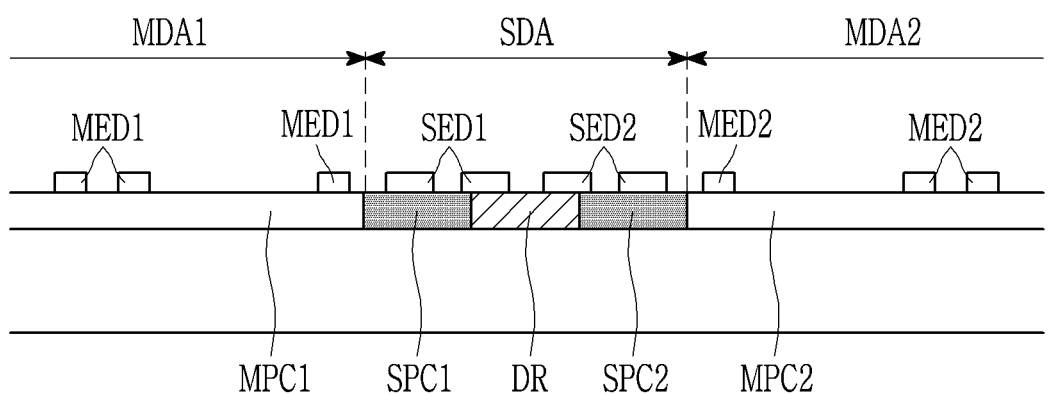
FIG. 3 illustrates a cross-sectional view with respect to a line of FIG. 2.

FIG. 1 illustrates a top plan view of a display device according to an embodiment, FIG. 2 illustrates an enlarged predetermined region of FIG. 1, and FIG. 3 illustrates a cross-sectional view with respect to a line of FIG. 2.

As illustrated in FIG. 1, a display device 1000 according to an embodiment includes a substrate 110 including a display area (DA) and a peripheral area (PA).

The display area (DA) may be positioned in a center of the display device 1000. It may have a substantially quadrangular shape, and one or more corners may have a round shape. However, the shape of the display area (DA) and the shape of the one ore more corners are not limited thereto, and may be changeable in many ways. The display area (DA) may include a first main display area MDA1, a second main display area MDA2, and a sub-display area (SDA). FIG. 2 illustrates a portion of the display area (DA) illustrated in FIG. 1, and illustrates a first main display area MDA1, a second main display area MDA2, and a boundary (BD) of the sub-display area (SDA).

The first main display area MDA1 and the second main display area MDA2 may be positioned on respective sides of the sub-display area (SDA). For example, the first main display area MDA1 may be positioned on a left of the sub-display area (SDA), and the second main display area MDA2 may be positioned on a right of the sub-display area (SDA). That is, the sub-display area (SDA) may be positioned between the first main display area MDA1 and the second main display area MDA2. The first main display area MDA1 may have a similar size to the second main display area MDA2, and the sub-display area (SDA) may have a relatively smaller size than the first main display area MDA1 and the second main display area MDA2. However, without being limited thereto, the positions and the sizes of the first main display area MDA1, the second main display area MDA2, and the sub-display area (SDA) may be modified in many ways. For example, the first main display area MDA1 may be relatively bigger than the second main display area MDA2.

The peripheral area (PA) may surround the display area (DA). The peripheral area (PA) is a region configured to display no images, and it may be positioned on an exterior side of the display device. Depending on different designs, a sub-display area may be further positioned on an edge of the display area (DA) provided near the peripheral area (PA).

Pixel circuits (MPC1, MPC2, SPC1, and SPC2) and light-emitting devices (MED1, MED2, SED1, and SED2) connected thereto may be positioned on the substrate 110. The pixel circuits (MPC1, MPC2, SPC1, and SPC2) and the light-emitting devices (MED1, MED2, SED1, and SED2) may be positioned in the display area (DA).

The pixel circuits (MPC1, MPC2, SPC1, and SPC2) may include main pixel circuits (MPC1 and MPC2) and sub-pixel circuits (SPC1 and SPC2). The main pixel circuits (MPC1 and MPC2) may include a first main pixel circuit MPC1 positioned on the first main display area MDA1 and a second main pixel circuit MPC2 positioned on the second main display area MDA2. The sub-pixel circuits (SPC1 and SPC2) may include a first sub-pixel circuit SPC1 and a second sub-pixel circuit SPC2 positioned in the sub-display area (SDA). The first main pixel circuit MPC1 substantially indicates a region in which a plurality of first main pixel circuits MPC1 are arranged in a matrix form, and the second main pixel circuit MPC2 substantially indicates a region in which a plurality of second main pixel circuits MPC2 are arranged in a matrix form. The first sub-pixel circuit SPC1 substantially indicates a region in which a plurality of first sub-pixel circuits SPC1 are arranged in a matrix form, and the second sub-pixel circuit SPC2 substantially indicates a region in which a plurality of second sub-pixel circuits SPC2 are arranged in a matrix form. The arrangement form of a plurality of pixel circuits is not specifically limited, and they may be arranged in many ways. For example a plurality of pixel circuits (MPC1, MPC2, SPC1, and SPC2) may not be orthogonal to each other and may traverse each other in an inclined direction.

The light-emitting devices (MED1, MED2, SED1, and SED2) may include main light-emitting devices (MED1 and MED2) and sub-light-emitting devices (SED1 and SED2). The main light-emitting device (MED1 and MED2) may include a first main light-emitting device MED1 positioned in a first main display area MDA1 and a second main light-emitting device MED2 positioned in a second main display area MDA2. The first main light-emitting device MED1 is connected to the first main pixel circuit MPC1, and the second main light-emitting device MED2 is connected to the second main pixel circuit MPC2. The sub-light-emitting devices (SED1 and SED2) may include a first sub-light-emitting device SED1 and a second sub-light-emitting device SED2 positioned in the sub-display area (SDA). The first sub-light-emitting device SED1 is connected to the first sub-pixel circuit SPC1, and the second sub-light-emitting device SED2 is connected to the second sub-pixel circuit SPC2. The respective light-emitting devices (MED1, MED2, SED1, and SED2) may emit predetermined light. For example, the light-emitting devices (MED1, MED2, SED1, and SED2) may emit red, green, and blue or white light. The display area (DA) may display a predetermined image through the light emitted by the light-emitting devices (MED1, MED2, SED1, and SED2).

A driving circuit (DR) may be further positioned on the substrate 110. The driving circuit (DR) may include a plurality of drivers and signal wires. For example, the driving circuit (DR) may include a scan driver, a data driver, a driving voltage supply line, a common voltage supply line, and a signal transmitting wire connected thereto. The scan driver generates a scan signal and transmits the same to the pixel circuits (MPC1, MPC2, SPC1, and SPC2) through the scan line. The data driver generates a data signal and transmits the same to the pixel circuits (MPC1, MPC2, SPC1, and SPC2) through the data line. The driving voltage supply line transmits a driving voltage to the pixel circuits (MPC1, MPC2, SPC1, and SPC2). The common voltage supply line transmits a common voltage to one electrode of the light-emitting devices (MED1, MED2, SED1, and SED2). At least part of the driving circuit (DR) may be positioned in the sub-display area (SDA). For example, the scan driver of the driving circuit (DR) may be positioned in the sub-display area (SDA). Another part of the driving circuit (DR) may be positioned in the peripheral area (PA).

The driving circuit (DR) may be positioned in a center of the sub-display area (SDA). The first sub-pixel circuit SPC1 and the second sub-pixel circuit SPC2 may be positioned on respective sides of the driving circuit (DR). For example, the first sub-pixel circuit SPC1 may be positioned on the left of the driving circuit (DR), and the second sub-pixel circuit SPC2 may be positioned on the right of the driving circuit (DR). That is, the driving circuit (DR) may be positioned between the first sub-pixel circuit SPC1 and the second sub-pixel circuit SPC2. The driving circuit (DR) may not overlap the first sub-pixel circuit SPC1 and the second sub-pixel circuit SPC2.

In the first main display area MDA1, the first main pixel circuit MPC1 may be connected to the first main light-emitting device MED1 positioned thereon. In this instance, the light emitting area of the first main light-emitting device MED1 may overlap the first main pixel circuit MPC1 connected to the light emitting area thereof. In the second main display area MDA2, the second main pixel circuit MPC2 may be connected to the second main light-emitting device MED2 positioned thereon. In this instance, the light emitting area of the second main light-emitting device MED2 may overlap the second main pixel circuit MPC2 connected to the light emitting area thereof.

In the sub-display area (SDA), the first sub-pixel circuit SPC1 may be connected to the first sub-light-emitting device SED1 spaced therefrom with a predetermined interval. The first sub-light-emitting device SED1 may include an anode, an emission layer, and a cathode, and may be connected to the first sub-pixel circuit SPC1 by the extension (Ex) extending from the anode. A portion of the light emitting area of the first sub-light-emitting device SED1 may overlap the first sub-pixel circuit SPC1 connected to the light emitting area thereof. Another portion of the light emitting area of the first sub-light-emitting device SED1 may overlap the first sub-pixel circuit SPC1 connected to the light emitting area thereof, and may overlap the driving circuit (DR). A predetermined light emitting area of the first sub-light-emitting device SED1 may overlap the first sub-pixel circuit SPC1 connected to the predetermined light emitting area thereof.

In the sub-display area (SDA), the second sub-pixel circuit SPC2 may be connected to the second sub-light-emitting device SED2 spaced therefrom with a predetermined interval. The first sub-light-emitting device SED2 may include an anode, an emission layer, and a cathode, and may be connected to the second sub-pixel circuit SPC2 by the extension (Ex) extending from the anode. A portion of the light emitting area of the second sub-light-emitting device SED2 may overlap the second sub-pixel circuit SPC2 connected to the light emitting area thereof. Another portion of the light emitting area of the second sub-light-emitting device SED2 may overlap the second sub-pixel circuit SPC2 not connected to the light emitting area thereof, and may overlap the driving circuit (DR). A predetermined light emitting area of the second sub-light-emitting device SED2 may overlap the second sub-pixel circuit SPC2 connected to the predetermined light emitting area thereof.

In the general display device, a pixel circuit and a light-emitting device are positioned in the display area (DA), and the driving circuit (DR) is positioned in the peripheral area (PA). That is, in general, the driving circuit (DR) is not positioned in the display area (DA), and the light-emitting device is not positioned on the driving circuit (DR). Regarding the display device according to an embodiment, the sub-light-emitting devices SED1 and SED2 overlap not only the sub-pixel circuits (SPC1 and SPC2) but also the driving circuit (DR), thereby expanding the screen displayed region. That is, at least part of the driving circuit (DR) may be positioned in the sub-display area (SDA), thereby reducing the area of the peripheral area (PA) and reducing the bezel.

Regarding the display device according to an embodiment, the first sub-light-emitting device SED1 and the second sub-light-emitting device SED2 connected to the first sub-pixel circuit SPC1 and the second sub-pixel circuit SPC2 positioned on respective sides of the driving circuit (DR) overlap the driving circuit (DR). Compared to the case in which the sub-pixel circuit is positioned on one side of the driving circuit (DR), a greater number of the sub-light-emitting devices SED1 and SED2 may overlap the driving circuit (DR) in the display device according to an embodiment. Therefore, resolution of the sub-display area (SDA) may be further improved in the display device according to an embodiment.

The resolution of the sub-display area (SDA) may be lower than the resolutions of the first main display area MDA1 and the second main display area MDA2. The resolutions of the first main display area MDA1 and the second main display area MDA2 may be the same or different. The number of the sub-light-emitting devices SED1 and SED2 for each area may be less than the number of the main light-emitting devices MED1 and MED2 for each area. The sub-light-emitting devices SED1 and SED2 may be bigger than the main light-emitting devices MED1 and MED2 The sub-pixel circuits (SPC1 and SPC2) may be bigger than the main pixel circuits (MPC1 and MPC2).

A correction relationship between respective pixel circuits and a light-emitting device of a display device according to an embodiment will now be described with reference to FIG. 4 and FIG. 5.

Figure 4:
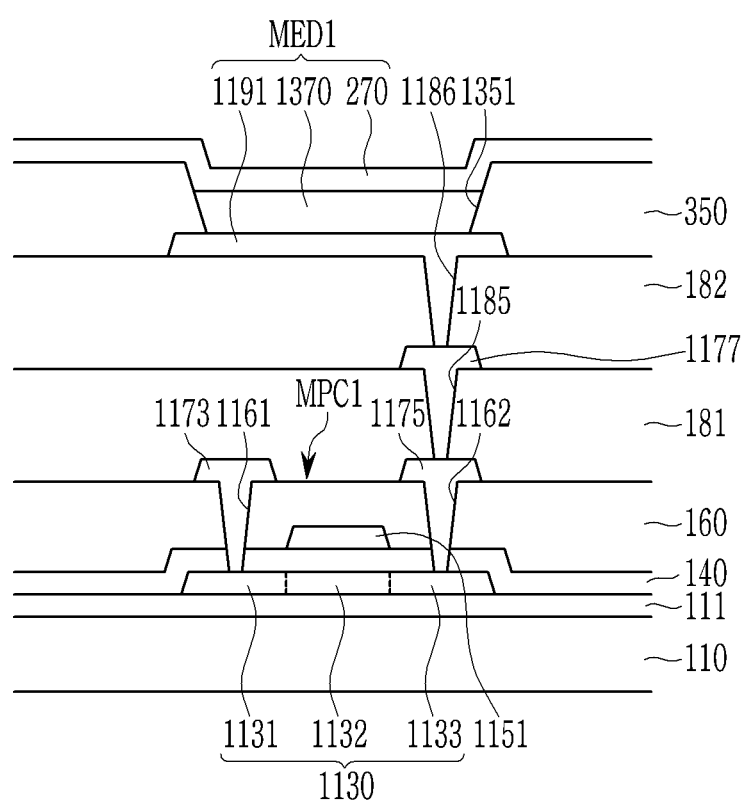
FIG. 4 illustrates a cross-sectional view of a first main pixel circuit and a first main light-emitting device of a display device according to an embodiment.
Figure 5:
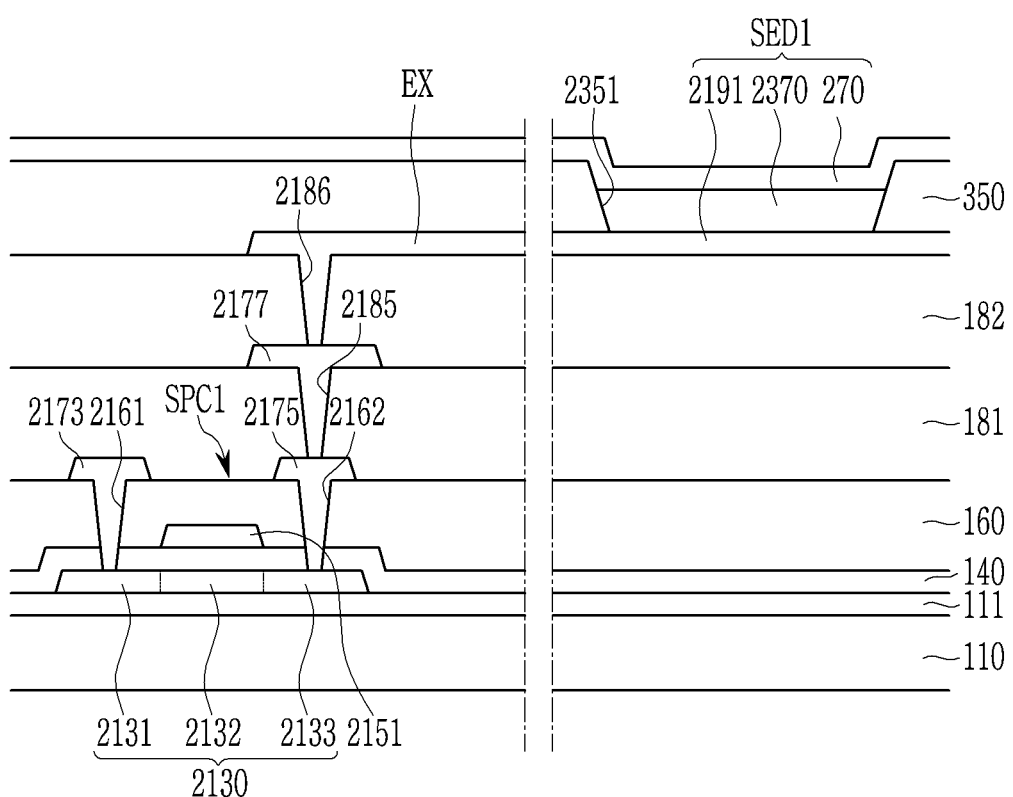
FIG. 5 illustrates a cross-sectional view of a first sub-pixel circuit and a first sub-light-emitting device of a display device according to an embodiment.

FIG. 4 illustrates a cross-sectional view of a first main pixel circuit MPC1 and a first main light-emitting device MED1 of a display device according to an embodiment, and FIG. 5 illustrates a cross-sectional view of a first sub-pixel circuit SPC1 and a first sub-light-emitting device SED1 of a display device according to an embodiment.

As illustrated in FIG. 4, a light emitting area of the first main light-emitting device MED1 of the display device according to an embodiment overlaps the first main pixel circuit MPC1 connected to the first main light-emitting device MED1.

The first main pixel circuit MPC1 may include a semiconductor 1130, a gate electrode 1151, a source electrode 1173, and a drain electrode 1175 on the substrate 110.

The substrate 110 may include at least one of polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 110 may include a flexible material that is folded or bent, and it may be single-layered or multi-layered.

A buffer layer 111 may be positioned on the substrate 110. The buffer layer 111 may have a single-layered or multi-layered structure. The buffer layer 111 may include an inorganic insulating material or organic insulating material such as a silicon nitride (SiNx), a silicon oxide (SiOx), or a silicon oxynitride (SiOxNy). The buffer layer 111 may be omitted depending on cases. A barrier layer may be further positioned between the substrate 110 and the buffer layer 111. The barrier may have a single-layered or multi-layered structure. The barrier may include an inorganic insulating material such as a silicon nitride (SiNx), a silicon oxide (SiOx), or a silicon oxynitride (SiOxNy).

A semiconductor layer including a semiconductor 1130 of the first main pixel circuit MPC1 may be positioned on the buffer layer 111. The semiconductor 1130 may include a first region 1131, a channel 1132, and a second region 1133. The first region 1131 and the second region 1133 may be respectively positioned on respective sides of the channel 1132 of the semiconductor 1130 of the first main pixel circuit MPC1. The semiconductor 1130 of the first main pixel circuit MPC1 may include a semiconductor material such as amorphous silicon, polysilicon, or an oxide semiconductor.

A gate insulating layer 140 may be positioned on the semiconductor 1130 of the first main pixel circuit MPC1. The gate insulating layer 140 may have a single-layered or multi-layered structure. The gate insulating layer 140 may include an inorganic insulating material such as a silicon nitride (SiNx), a silicon oxide (SiOx), or a silicon oxynitride (SiOxNy).

A gate conductive layer including a gate electrode 1151 of the first main pixel circuit MPC1 may be positioned on the gate insulating layer 140. The gate electrode 1151 of the first main pixel circuit MPC1 may overlap the channel 1132 of the semiconductor 1130. The gate conductive layer may have a single-layered or multi-layered structure. The gate conductive layer may include a metal material such as molybdenum (Mo), aluminum (Al), copper (Cu), and/or titanium (Ti). The doping process or the plasma processing may be performed after the gate conductive layer is formed. A portion of the semiconductor layer covered by the gate conductive layer may not be doped or plasma processed, and a portion of the semiconductor layer not covered by the gate conductive layer may be doped or plasma processed to have the same characteristic as a conductor.

An interlayer insulating layer 160 may be positioned on the gate electrode 1151 of the first main pixel circuit MPC1. The interlayer insulating layer 160 may have a single-layered or multi-layered structure. The interlayer insulating layer 160 may include an inorganic insulating material or an organic insulating material.

A first data conductive layer including a source electrode 1173 and a drain electrode 1175 of the first main pixel circuit MPC1 may be positioned on the interlayer insulating layer 160. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The interlayer insulating layer 160 may include an opening 1161 overlapping the source electrode 1173 of the first main pixel circuit MPC1 and the first region 1131 of the semiconductor 1130. The source electrode 1173 of the first main pixel circuit MPC1 may be connected to the first region 1131 of the semiconductor 1130 through the opening 1161. The interlayer insulating layer 160 may include an opening 1162 overlapping the drain electrode 1175 of the first main pixel circuit MPC1 and the second region 1133 of the semiconductor 1130. The drain electrode 1175 of the first main pixel circuit MPC1 may be connected to the second region 1133 of the semiconductor 1130 through the opening 1162.

A first passivation layer 181 and a second passivation layer 182 may be sequentially positioned on the source electrode 1173 and the drain electrode 1175 of the first main pixel circuit MPC1. The first passivation layer 181 and the second passivation layer 182 may include general polymers such as poly(methyl methacrylate) (PMMA) or polystyrene (PS), a polymer derivative with a phenol-based group, an acryl-based polymer, an imide-based polymer, and an organic insulating material such as a polyimide, an acryl-based polymer, or a siloxane-based polymer.

A second data conductive layer including a connection electrode 1177 may be positioned between the first passivation layer 181 and the second passivation layer 182. The first passivation layer 181 may include an opening 1185 overlapping the connection electrode 1177 and the drain electrode 1175. The connection electrode 1177 may be connected to the drain electrode 1175 through the opening 1185.

A first main light-emitting device MED1 connected to the first main pixel circuit MPC1 may be positioned on the second passivation layer 182. The first main light-emitting device MED1 may include a pixel electrode 1191, a light-emitting device layer 1370, and a common electrode 270.

The pixel electrode 1191 of the first main light-emitting device MED1 may be positioned on the second passivation layer 182. The second passivation layer 182 may include an opening 1186 overlapping the pixel electrode 1191 and the connection electrode 1177. The pixel electrode 1191 of the first main light-emitting device MED1 may be connected to the connection electrode 1177 through the opening 1186. The connection electrode 1177 may connect between the drain electrode 1175 and the pixel electrode 1191. However, without being limited thereto, the drain electrode 1175 may be directly connected to the pixel electrode 1191 without the connection electrode depending on embodiments.

A partition wall 350 may be positioned on the pixel electrode 1191 of the first main light-emitting device MED1. A pixel opening 1351 is formed in the partition wall 350, and the pixel opening 1351 in the partition wall 350 may overlap the pixel electrode 1191.

A light-emitting device layer 1370 of the first main light-emitting device MED1 may be positioned in the pixel opening 1351 of the partition wall 350. The light-emitting device layer 1370 may overlap the pixel electrode 1191.

A common electrode 270 may be positioned on the light-emitting device layer 1370 and the partition wall 350.

The first main light-emitting device MED1 emits light with reference to a region in which the pixel electrode 1191, the light-emitting device layer 1370, and the common electrode 270 overlap each other, and the light emitting area of the first main light-emitting device MED1 may overlap the first main pixel circuit MPC1 connected to the light emitting area thereof.

The structures of the second main pixel circuit MPC2 and the second main light-emitting device MED2 are similar to the structures of the first main pixel circuit MPC1 and the first main light-emitting device MED1, and no detailed descriptions thereof will be provided. For example, the second main pixel circuit MPC2 and the second main light-emitting device MED2 may have bilaterally symmetrical structures to the first main pixel circuit MPC1 and the first main light-emitting device MED1.

As illustrated in FIG. 5, the light emitting area of the first sub-light-emitting device SED1 of the display device according to an embodiment may not overlap the first sub-pixel circuit SPC1 connected to the first sub-light-emitting device SED1.

The first sub-pixel circuit SPC1 may include a semiconductor 2130, a gate electrode 2151, a source electrode 2173, and a drain electrode 2175 positioned on the substrate 110.

A buffer layer 111 may be positioned on the substrate 110, and the semiconductor 2130 of the first sub-pixel circuit SPC1 may be positioned on the buffer layer 111. The semiconductor 2130 of the first sub-pixel circuit SPC1 may be positioned on the semiconductor layer.

A gate insulating layer 140 may be positioned on the semiconductor 2130 of the first sub-pixel circuit SPC1, and a gate electrode 2151 of the first sub-pixel circuit SPC1 may be positioned on the gate insulating layer 140. The gate electrode 2151 of the first sub-pixel circuit SPC1 may be positioned on the gate conductive layer. The gate electrode 2151 of the first sub-pixel circuit SPC1 may overlap the channel 2132 of the semiconductor 2130.

An interlayer insulating layer 160 may be positioned on the gate electrode 2151 of the first sub-pixel circuit SPC1, and a source electrode 2173 and a drain electrode 2175 of the first sub-pixel circuit SPC1 may be positioned on the interlayer insulating layer 160. The source electrode 2173 and the drain electrode 2175 of the first sub-pixel circuit SPC1 may be positioned on the first data conductive layer.

The interlayer insulating layer 160 may include an opening 2161 overlapping the source electrode 2173 of the first sub-pixel circuit SPC1 and the first region 2131 of the semiconductor 2130. The source electrode 2173 of the first sub-pixel circuit SPC1 may be connected to the first region 2131 of the semiconductor 2130 through the opening 2161. The interlayer insulating layer 160 may include an opening 2162 overlapping the drain electrode 2175 of the first sub-pixel circuit SPC1 and the second region 2133 of the semiconductor 2130. The drain electrode 2175 of the first sub-pixel circuit SPC1 may be connected to the second region 2133 of the semiconductor 2130 through the opening 2162.

A first passivation layer 181 and a second passivation layer 182 may be sequentially positioned on the source electrode 2173 and the drain electrode 2175 of the first sub-pixel circuit SPC1. A connection electrode 2177 may be positioned between the first passivation layer 181 and the second passivation layer 182. The connection electrode 2177 of the first sub-pixel circuit SPC1 may be positioned on the second data conductive layer. The first passivation layer 181 may include an opening 2185 overlapping the connection electrode 2177 and the drain electrode 2175. The connection electrode 2177 may be connected to the drain electrode 2175 through the opening 2185.

A first sub-light-emitting device SED1 connected to the first sub-pixel circuit SPC1 may be positioned on the second passivation layer 182. The first sub-light-emitting device SED1 may include a pixel electrode 2191, a light-emitting device layer 2370, and a common electrode 270.

The pixel electrode 2191 of the first sub-light-emitting device SED1 may be positioned on the second passivation layer 182. The pixel electrode 2191 of the first sub-light-emitting device SED1 may include an extension (Ex). The second passivation layer 182 may include an opening 2186 overlapping the extension (Ex) of the pixel electrode 2191 and the connection electrode 2177. The extension (Ex) of the pixel electrode 2191 of the first sub-light-emitting device SED1 may be connected to the connection electrode 2177 through the opening 2186. The connection electrode 2177 may connect between the drain electrode 2175 and the pixel electrode 2191. However, without being limited thereto, depending on embodiments, the drain electrode 2175 may be directly connected to the pixel electrode 2191 without a connection electrode.

A partition wall 350 may be positioned on the pixel electrode 2191 of the first sub-light-emitting device SED1. A pixel opening 2351 is formed in the partition wall 350, and the pixel opening 2351 in the partition wall 350 may overlap the pixel electrode 2191.

A light-emitting device layer 2370 of the first sub-light-emitting device SED1 may be positioned in the pixel opening 2351 of the partition wall 350. The light-emitting device layer 2370 may overlap the pixel electrode 2191.

A common electrode 270 may be positioned on the light-emitting device layer 2370 and the partition wall 350. The common electrode 270 of the first sub-light-emitting device SED1 and the common electrode 270 of the first main light-emitting device MED1 may be integrally formed, and may be on most of the region on the substrate 110.

The first sub-light-emitting device SED1 emits light with respect to the region in which the pixel electrode 2191, the light-emitting device layer 2370, and the common electrode 270 overlap each other, and the light emitting area of the first sub-light-emitting device SED1 may not overlap the first sub-pixel circuit SPC1 connected to the light emitting area thereof. The extension (EX) of the pixel electrode 2191 becomes longer as a distance between the first sub-light-emitting device SED1 and the first sub-pixel circuit SPC1 increases. For example, the extension (EX) connected to the first sub-light-emitting device SED1 positioned in the center of the driving circuit (DR) may be longer than the extension (Ex) connected to the first sub-light-emitting device SED1 positioned on a left edge of the driving circuit (DR).

The second sub-pixel circuit SPC2 and the second sub-light-emitting device SED2 have similar structures to the first sub-pixel circuit SPC1 and the first sub-light-emitting device SED1, and no detailed descriptions thereof will be provided. For example, the second sub-pixel circuit SPC2 and the second sub-light-emitting device SED2 may have bilaterally symmetrical structures to the first sub-pixel circuit SPC1 and the first sub-light-emitting device SED1.

The connection relationship between one of the transistors included in the respective pixel circuits (MPC1, MPC2, SPC1, and SPC2) and the light-emitting devices (MED1, MED2, SED1, and SED2) has been described in the above, and the pixel circuits (MPC1, MPC2, SPC1, and SPC2) may respectively include a plurality of transistors. A plurality of transistors included in the respective pixel circuits (MPC1, MPC2, SPC1, and SPC2) will now be described with reference to FIG. 6.

Figure 6:
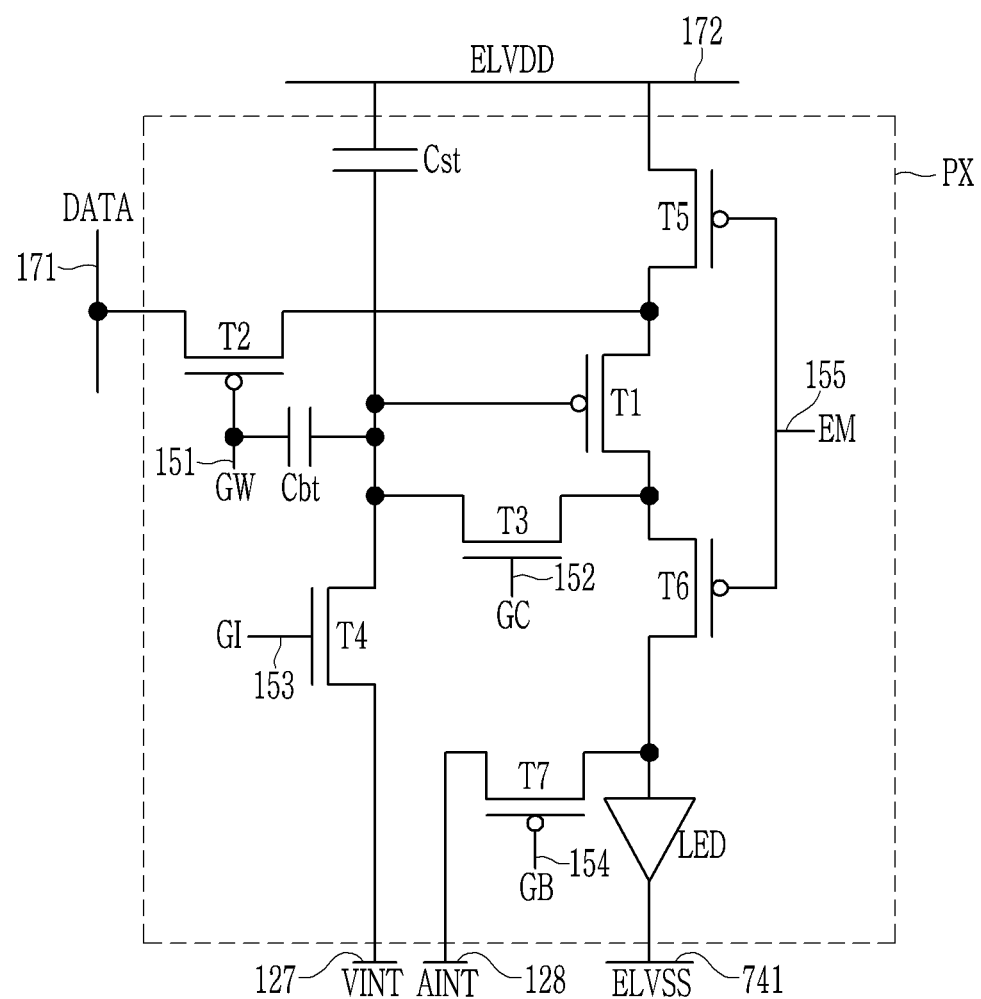
FIG. 6 illustrates a circuit diagram of a display device according to an embodiment.

FIG. 6 illustrates a circuit diagram of a display device according to an embodiment.

As illustrated in FIG. 6, one pixel PX of the display device according to an embodiment includes a plurality of transistors (T1, T2, T3, T4, T5, T6, and T7), a storage capacitor Cst, a boost capacitor (Cbt), and a light emitting diode (LED) connected to wires (127, 128, 151, 152, 153, 154, 155, 171, 172, and 741).

A plurality of wires (127, 128, 151, 152, 153, 154, 155, 171, 172, and 741) are connected to one pixel PX. The wires include a first initialization voltage line 127, a second initialization voltage line 128, a first scan signal line 151, a second scan signal line 152, an initialization control line 153, a bypass control line 154, a light emission line 155, a data line 171, a driving voltage line 172, and a common voltage line 741.

The first scan signal line 151 is connected to a gate driver (not illustrated) to transmit the first scan signal (GW) to the second transistor T2. The second scan signal line 152 may apply a voltage with opposite polarity to the voltage applied to the first scan signal line 151 at the same timing as the signal of the first scan signal line 151. For example, when a voltage with negative polarity is applied to the first scan signal line 151, a voltage with positive polarity may be applied to the second scan signal line 152. The second scan signal line 152 transmits a second scan signal (GC) to the third transistor T3.

The initialization control line 153 transmits an initialization control signal (GI) to the fourth transistor T4. The bypass control line 154 transmits a bypass signal (GB) to the seventh transistor T7. The bypass control line 154 may be configured with a first scan signal line 151 of a previous stage. The light emission line 155 transmits a light emission signal (EM) to the fifth transistor T5 and the sixth transistor T6.

The data line 171 represents a wire configured to transmit a data voltage (DATA) generated by a data driver (not illustrated), and luminance of light emitted by the light emitting diode (LED) changes according to the data voltage (DATA) applied to the pixel PX.

The driving voltage line 172 applies a driving voltage (ELVDD). The first initialization voltage line 127 transmits a first initialization voltage (VINT), and the second initialization voltage line 128 transmits a second initialization voltage (AINT). The common voltage line 741 applies a common voltage (ELVSS) to the cathode of the light emitting diode (LED). In the present embodiment, constant voltages may be applied to the driving voltage line 172, the first and second initialization voltage lines 127 and 128, and the common voltage line 741.

A structure and a connection relationship of a plurality of transistors will now be described.

The driving transistor T1 may have a p-type transistor characteristic, and may include a polycrystalline semiconductor. The driving transistor T1 controls a size of a current output to the anode of the light emitting diode (LED) according to the data voltage (DATA) applied to the gate electrode of the driving transistor T1. The brightness of the light emitting diode (LED) is controlled by the size of the driving current output to the anode of the light emitting diode (LED), so the luminance of the light emitting diode (LED) may be controlled according to the data voltage (DATA) applied to the pixel PX. For this purpose, a first electrode of the driving transistor T1 is disposed to receive the driving voltage (ELVDD), and is connected to the driving voltage line 172 through the fifth transistor T5. The first electrode of the driving transistor T1 is also connected to a second electrode of the second transistor T2 to receive the data voltage (DATA). A second electrode of the driving transistor T1 is disposed to output a current toward the light emitting diode (LED), and is connected to the anode of the light emitting diode (LED) through the sixth transistor T6. The second electrode of the driving transistor T1 transmits the data voltage (DATA) applied to the first electrode to the third transistor T3. A gate electrode of the driving transistor T1 is connected to one electrode (hereinafter, a second storage electrode) of the storage capacitor Cst. The voltage at the gate electrode of the driving transistor T1 changes according to the voltage stored in the storage capacitor Cst, and hence, the driving current output by the driving transistor T1 changes. Further, the storage capacitor Cst maintains the voltage at the gate electrode of the driving transistor T1 for one frame.

The second transistor T2 may have a p-type transistor characteristic, and may include a polycrystalline semiconductor. The second transistor T2 receives the data voltage (DATA) into the pixel PX. A gate electrode of the second transistor T2 is connected to the first scan signal line 151 and one electrode (hereinafter, a lower boost electrode) of the boost capacitor (Cbt). The first electrode of the second transistor T2 is connected to the data line 171. The second electrode of the second transistor T2 is connected to the first electrode of the driving transistor T1. When the second transistor T2 is turned on by the voltage with negative polarity from among the first scan signal (GW) transmitted through the first scan signal line 151, the data voltage (DATA) transmitted through the data line 171 is transmitted to the first electrode of the driving transistor T1.

The third transistor T3 may have an n-type transistor characteristic, and may include an oxide semiconductor. The third transistor T3 electrically connects the second electrode of the driving transistor T1 and the gate electrode of the driving transistor T1. As a result, the third transistor T3 transmits a compensation voltage generated when the data voltage (DATA) passes through the driving transistor T1 to the second storage electrode of the storage capacitor Cst. The gate electrode of the third transistor T3 is connected to the second scan signal line 152, and the first electrode of the third transistor T3 is connected to the second electrode of the driving transistor T1. The second electrode of the third transistor T3 is connected to the second storage electrode of the storage capacitor Cst, the gate electrode of the driving transistor T1, and another electrode (hereinafter, an upper boost electrode) of the boost capacitor (Cbt). The third transistor T3 is turned on by the voltage with positive polarity from among the second scan signal (GC) transmitted through the second scan signal line 152 to connect the gate electrode of the driving transistor T1 and the second electrode of the driving transistor T1, and it transmits the voltage applied to the gate electrode of the driving transistor T1 to the second storage electrode of the storage capacitor Cst to store the same in the storage capacitor Cst.

The fourth transistor T4 may have an n-type transistor characteristic, and may include an oxide semiconductor. The fourth transistor T4 initializes the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 passes through the second electrode of the third transistor T3 and is connected to the second storage electrode of the storage capacitor Cst, the gate electrode of the driving transistor T1, and the upper boost electrode. The fourth transistor T4 is turned on by the voltage with positive polarity from among the initialization control signal (GI) transmitted through the initialization control line 153, and in this instance, it transmits the first initialization voltage (VINT) to the gate electrode of the driving transistor T1 and the second storage electrode of the storage capacitor Cst. Accordingly, the voltage at the gate electrode of the driving transistor T1 and the storage capacitor Cst are initialized.

The fifth transistor T5 may have a p-type transistor characteristic, and may include a polycrystalline semiconductor. The fifth transistor T5 transmits the driving voltage (ELVDD) to the driving transistor T1. The gate electrode of the fifth transistor T5 is connected to the light emission line 155, the first electrode of the fifth transistor T5 is connected to the driving voltage line 172, and the second electrode of the fifth transistor T5 is connected to the first electrode of the driving transistor T1.

The sixth transistor T6 may have a p-type transistor characteristic, and may include a polycrystalline semiconductor. The sixth transistor T6 transmits the driving current output by the driving transistor T1 to the light emitting diode (LED). A gate electrode of the sixth transistor T6 is connected to the light emission line 155, a first electrode of the sixth transistor T6 is connected to the second electrode of the driving transistor T1, and a second electrode of the sixth transistor T6 is connected to the anode of the light emitting diode (LED).

The seventh transistor T7 may have a p-type transistor characteristic, and may include a polycrystalline semiconductor. The seventh transistor T7 initializes the anode of the light emitting diode (LED). A gate electrode of the seventh transistor T7 is connected to the bypass control line 154, a first electrode of the seventh transistor T7 is connected to the anode of the light emitting diode (LED), and a second electrode of the seventh transistor T7 is connected to the second initialization voltage line 128. When the seventh transistor T7 is turned on by the voltage with negative polarity from among the bypass signal (GB), the second initialization voltage (AINT) is applied to the anode of the light emitting diode (LED) to be initialized.

It has been described in the above that one pixel PX includes seven transistors (T1 to T7), one storage capacitor Cst, and one boost capacitor (Cbt), but it is not limited thereto, and the number of transistors and capacitors and their connection relationships are modifiable in various ways In the present embodiment, the driving transistor T1 may include a polycrystalline semiconductor. The third transistor T3 and the fourth transistor T4 may include oxide semiconductors. The second transistor T2, the fifth transistor T5, the sixth transistor T6, and the seventh transistor T7 may include polycrystalline semiconductors. However, without being limited thereto, at least one of the second transistor T2, the fifth transistor T5, the sixth transistor T6, and the seventh transistor T7 may include an oxide semiconductor. A plurality of transistors may include polycrystalline semiconductors.

A display device according to an embodiment will now be described with reference to FIG. 7.

The display device according to an embodiment described with reference to FIG. 7 mostly corresponds to the display device according to an embodiment described with reference to FIG. 1 to FIG. 6, so no same portions will be described. The present embodiment is different from the previous embodiment in that a driving circuit is positioned on respective sides of the sub-pixel circuit, which will now be described.

Figure 7:
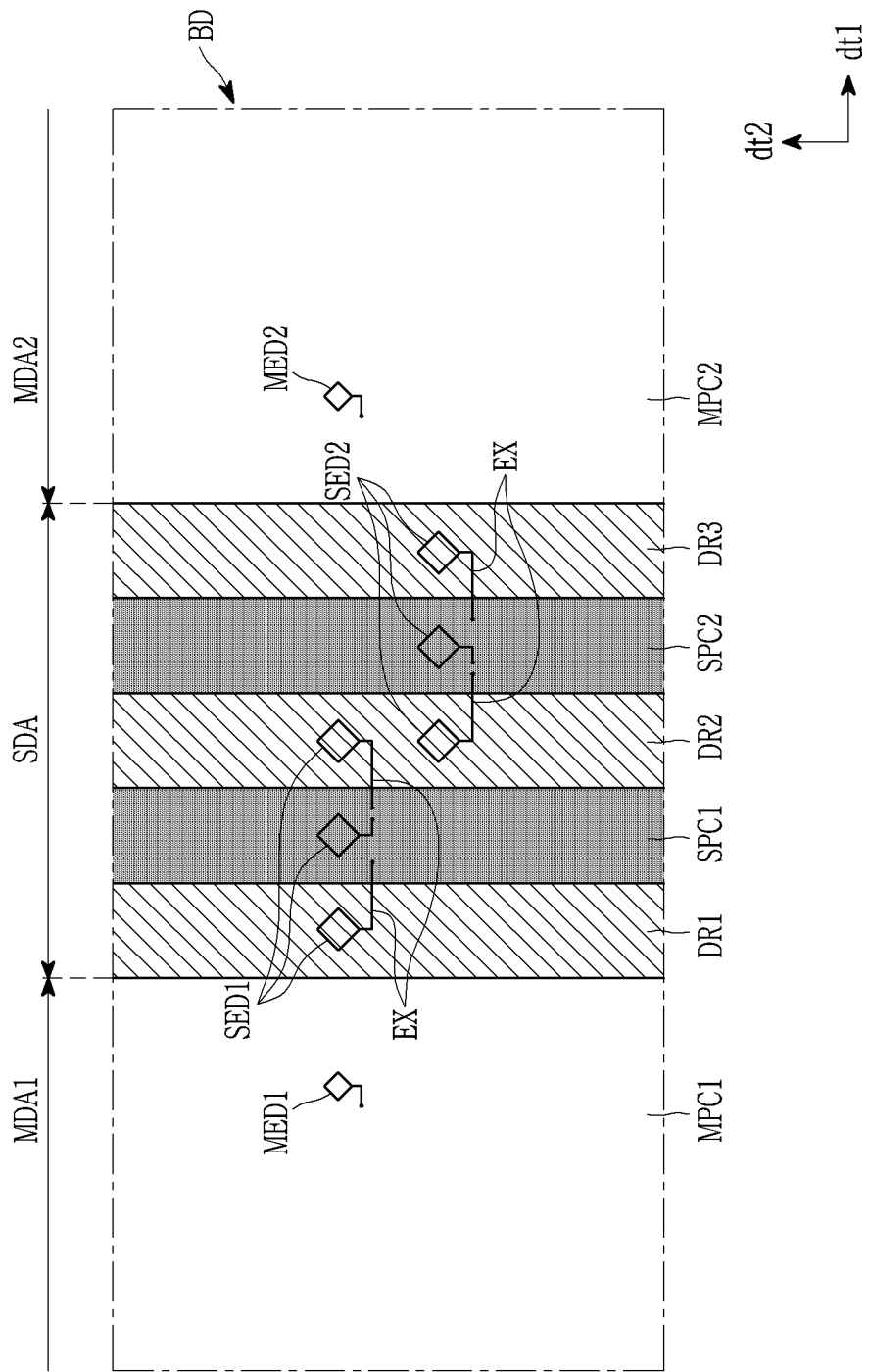
FIG. 7 illustrates a top plan view of a predetermined region of a display device according to an embodiment.

FIG. 7 illustrates a top plan view of a predetermined region of a display device according to an embodiment.

As illustrated in FIG. 7, the display device includes a first main display area MDA1, a second main display area MDA2, and a sub-display area (SDA) positioned therebetween.

The first main pixel circuit MPC1 and the first main light-emitting device MED1 connected to the first main pixel circuit MPC1 are positioned in the first main display area MDA1, and the second main pixel circuit MPC2 and the second main light-emitting device MED2 connected to the second main pixel circuit MPC2 are positioned in the second main display area MDA2.

Sub-light-emitting devices SED1 and SED2 may be positioned in the sub-display area (SDA). The sub-light-emitting devices SED1 and SED2 may include a first sub-light-emitting device SED1 connected to the first sub-pixel circuit SPC1 and a second sub-light-emitting device SED2 connected to the second sub-pixel circuit SPC2.

Driving circuits DR1, DR2, and DR3 may be positioned in the sub-display area (SDA). The driving circuits DR1, DR2, and DR3 may include a first driving circuit DR1, a second driving circuit DR2, and a third driving circuit DR3. The first driving circuit DR1, the second driving circuit DR2, and the third driving circuit DR3 may be spaced from each other. The second driving circuit DR2 may be positioned between the first driving circuit DR1 and the third driving circuit DR3. For example, the first driving circuit DR1 may be positioned on a left edge of the sub-display area (SDA) to be near the first main display area MDA1, and the third driving circuit DR3 may be positioned on a right edge of the sub-display area (SDA) to be near the second main display area MDA2. The second driving circuit DR2 may be positioned in the center of the sub-display area (SDA) between the first driving circuit DR1 and the second driving circuit DR2.

The first sub-pixel circuit SPC1 and the second sub-pixel circuit SPC2 may be positioned on respective sides of the second driving circuit DR2. For example, the first sub-pixel circuit SPC1 may be positioned on a left side of the second driving circuit DR2 as positioned in the drawing figure, and the second sub-pixel circuit SPC2 may be positioned on a right side of the second driving circuit DR2.

The first sub-pixel circuit SPC1 may be positioned between the first driving circuit DR1 and the second driving circuit DR2. The first sub-pixel circuit SPC1 may not overlap the first driving circuit DR1 and the second driving circuit DR2. The light emitting area of the first sub-light-emitting device SED1 connected to the first sub-pixel circuit SPC1 may overlap the first driving circuit DR1 or the second driving circuit DR2. For example, the first sub-light-emitting device SED1 connected to the first sub-pixel circuit SPC1 may extend to the left by the extension (EX) from the anode of the first sub-light-emitting device SED1 and may be positioned on the first driving circuit DR1. In another way, the first sub-light-emitting device SED1 connected to the first sub-pixel circuit SPC1 may extend to the extension (EX) of the anode and may be positioned on the second driving circuit DR2. A predetermined light emitting area of the first sub-light-emitting device SED1 may overlap the first sub-pixel circuit SPC1 connected to the predetermined light emitting area thereof.

The second sub-pixel circuit SPC2 may be positioned between the second driving circuit DR2 and the third driving circuit DR3. The second sub-pixel circuit SPC2 may not overlap the second driving circuit DR2 and the third driving circuit DR3. The light emitting area of the second sub-light-emitting device SED2 connected to the second sub-pixel circuit SPC2 may overlap the second driving circuit DR2 or the third driving circuit DR3. For example, the second sub-light-emitting device SED2 connected to the second sub-pixel circuit SPC2 may extend to the left by the extension (EX) of the anode and may be positioned on the second driving circuit DR2. In another way, the second sub-light-emitting device SED2 connected to the second sub-pixel circuit SPC2 may extend to the right by the extension (EX) of the anode of the second sub-light-emitting device SED2 and may be positioned on the third driving circuit DR3. A predetermined light emitting area of the second sub-light-emitting device SED2 may overlap the second sub-pixel circuit SPC2 connected to the predetermined light emitting area thereof. A gap is illustrated in the extension (EX) lines because the extension (EX) lines connect and reconnect to circuit elements in the respective sub-pixel circuits SPC1 and SPC2.

Regarding the display device according to an embodiment, the sub-light-emitting devices SED1 and SED2 overlap the sub-pixel circuits (SPC1 and SPC2) and also overlap the driving circuits DR1, DR2, and DR3, thereby expanding the screen displayed region. By using a configuration such as this, the area of the peripheral area (PA) may be further reduced and the bezel may be reduced by positioning a plurality of driving circuits DR1, DR2, and DR3 in the sub-display area (SDA).

A display device according to an embodiment will now be described with reference to FIG. 8 to FIG. 10.

The display device according to an embodiment described with reference to FIG. 8 to FIG. 10 mostly corresponds to the display device according to an embodiment described with reference to FIG. 1 to FIG. 6, so no same portions will be described. Embodiments described herein include a bendable area (BA), which will now be described.

Figure 8:
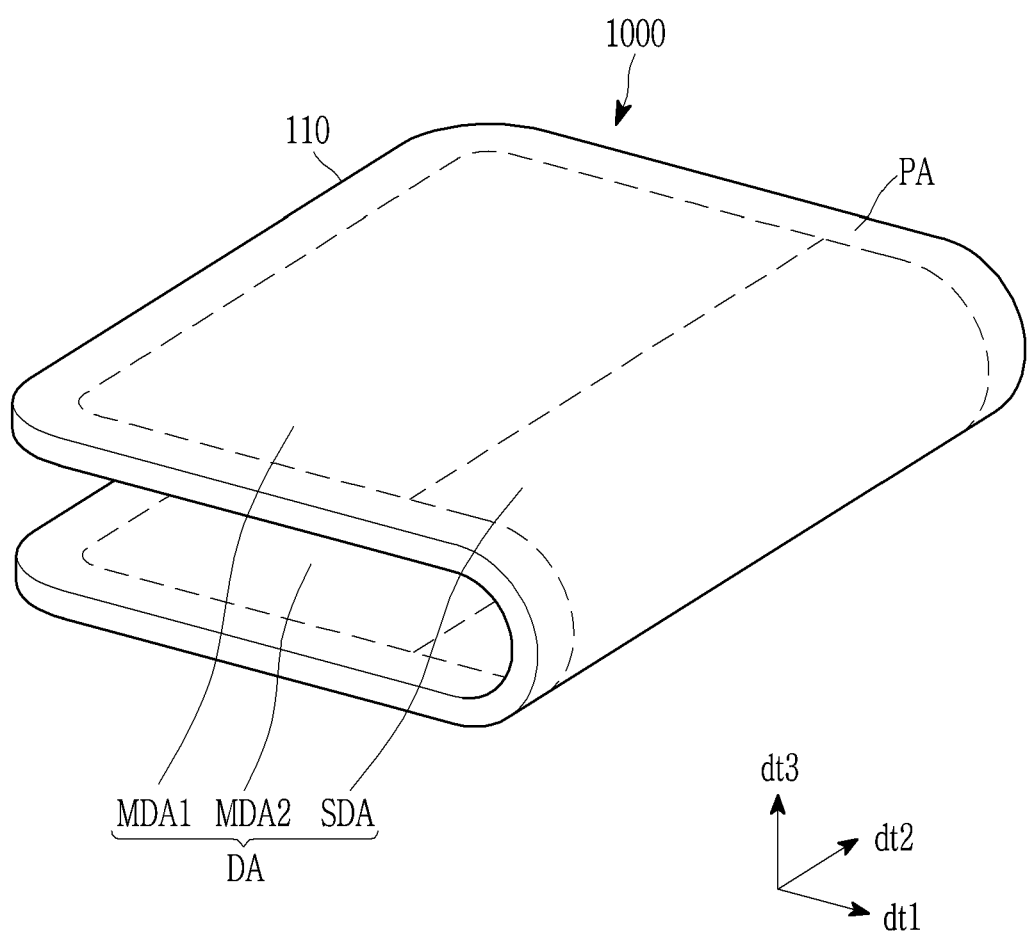
FIG. 8 and FIG. 9 illustrate perspective views of a display device according to an embodiment.
Figure 9:
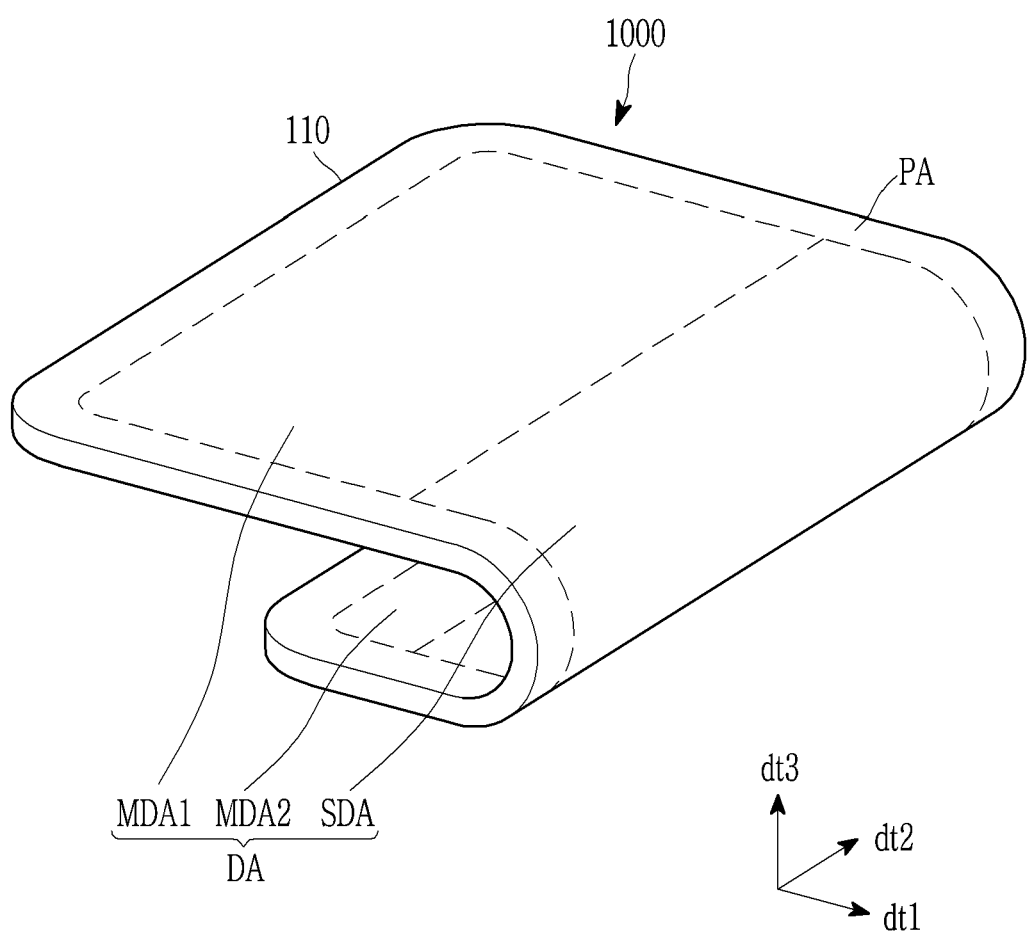
Figure 10:
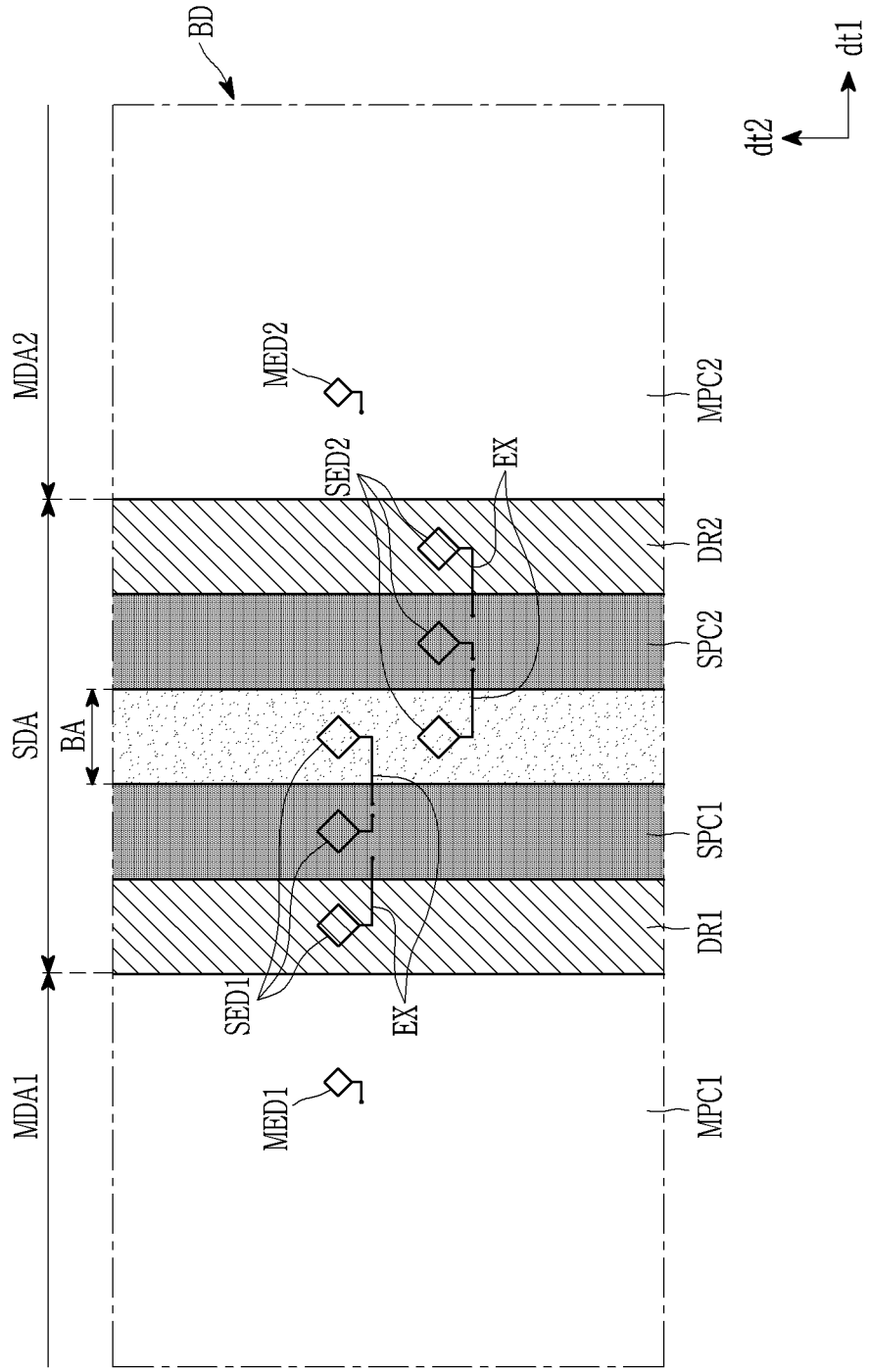
FIG. 10 illustrates a top plan view of a predetermined region of a display device according to an embodiment.

FIG. 8 and FIG. 9 illustrate perspective views of a display device according to an embodiment, and FIG. 10 illustrates a top plan view of a predetermined region of a display device according to an embodiment.

As illustrated in FIG. 8, at least a predetermined region of the display device 1000 may be bent.

The display device 1000 includes a substrate 110 having a display area (DA) and a peripheral area (PA). The display area (DA) may include a first main display area MDA1, a second main display area MDA2, and a sub-display area (SDA). A side configured to display an image in the first main display area MDA1 and the second main display area MDA2 may be parallel to the side defined by the first direction dt1 and the second direction dt2. A thickness direction of the display device 1000 may be a third direction dt3 that is perpendicular to the first direction dt1 and the second direction dt2. When the display device 1000 is bent, the first main display area MDA1 may overlap the second main display area MDA2 in the third direction dt3. A bending axis of the display device 1000 may be positioned in the sub-display area (SDA), and may be parallel to the second direction dt2. The display device 1000 may be out-folded with respect to the bending axis parallel to the second direction dt2. However, without being limited thereto, the display device 1000 may be in-folded with respect to the bending axis parallel to the second direction DR2. In another way, the display device 1000 may be both in-folded and out-folded. Out-folded and in-folded refer to bending the display device 1000 in different directions about the bending axis.

Referring to FIG. 8, the bending axis may be positioned in the center of the display device 1000. The first main display area MDA1 and the second main display area MDA2 may have similar sizes. However, without being limited thereto, the position of the bending axis, and the sizes of the first main display area MDA1 and the second main display area MDA2, are modifiable in various ways.

For example, as illustrated in FIG. 9, the bending axis may be positioned to be skewed toward one side from the center of the display device 1000 according to an embodiment. For example, the bending axis may be positioned near a right edge closer to the second main display area MDA2 of the display device 1000 according to an embodiment. In one embodiment, the first main display area MDA1 may be larger than the second main display area MDA2.

Alternatively, the bending axis may be positioned near a left edge closer to the first main display area MDA1 of the display device 1000 according to an embodiment. In such an embodiment, the second main display area MDA2 may be larger than the first main display area MDA1.

As illustrated in FIG. 10, the sub-display area (SDA) of the display device 1000 according to an embodiment may include a bendable area (BA). The bendable area (BA) may be positioned in the center of the sub-display area (SDA). However, without being limited thereto, the bendable area (BA) may have various positions in the sub-display area (SDA).

A first sub-pixel circuit SPC1 and a second sub-pixel circuit SPC2 may be positioned on respective sides of the bendable area (BA). The first sub-pixel circuit SPC1 and the second sub-pixel circuit SPC2 may not overlap the bendable area (BA).

A first driving circuit DR1 may be positioned on one side of the first sub-pixel circuit SPC1. The first sub-pixel circuit SPC1 may not overlap the first driving circuit DR1. The first sub-pixel circuit SPC1 may be positioned between the first driving circuit DR1 and the bendable area (BA). The light emitting area of the first sub-light-emitting device SED1 connected to the first sub-pixel circuit SPC1 may overlap the first driving circuit DR1 and/or the bendable area (BA). For example, the first sub-light-emitting device SED1 connected to the first sub-pixel circuit SPC1 may extend to the left by the extension (EX) of the anode and may be positioned on the first driving circuit DR1. In another way, the first sub-light-emitting device SED1 connected to the first sub-pixel circuit SPC1 extends to the right by the extension (EX) of the anode and may be positioned in the bendable area (BA). A predetermined light emitting area of the first sub-light-emitting device SED1 may also overlap the first sub-pixel circuit SPC1 connected to the predetermined light emitting area thereof.

A second driving circuit DR2 may be positioned on one side of the second sub-pixel circuit SPC2. The second sub-pixel circuit SPC2 may not overlap the second driving circuit DR2. The second sub-pixel circuit SPC2 may be positioned between the second driving circuit DR2 and the bendable area (BA). The light emitting area of the second sub-light-emitting device SED2 connected to the second sub-pixel circuit SPC2 may overlap the second driving circuit DR2 and/or the bendable area (BA). For example, the second sub-light-emitting device SED2 connected to the second sub-pixel circuit SPC2 may extend to the right by the extension (Ex) of the anode and may be positioned on the second driving circuit DR2. In another way, the second sub-light-emitting device SED2 connected to the second sub-pixel circuit SPC2 may extend to the left by the extension (EX) of the anode and may be positioned in the bendable area (BA). A predetermined light emitting area of the second sub-light-emitting device SED2 may also overlap the second sub-pixel circuit SPC2 connected to the predetermined light emitting area thereof.

Regarding the display device according to embodiments, the sub-light-emitting devices SED1 and SED2 overlap the sub-pixel circuits (SPC1 and SPC2) and also overlap the driving circuits DR1 and DR2 and the bendable area (BA), thereby expanding the screen displayed region. By positioning a plurality of driving circuits DR1 and DR2 in the sub-display area (SDA), the area of the peripheral area (PA) may be further reduced and the bezel size may be reduced. The screen may also be displayed in the bendable area (BA).

A cross-sectional shape of a bendable area (BA) will now be described with reference to FIG. 11.

Figure 11:
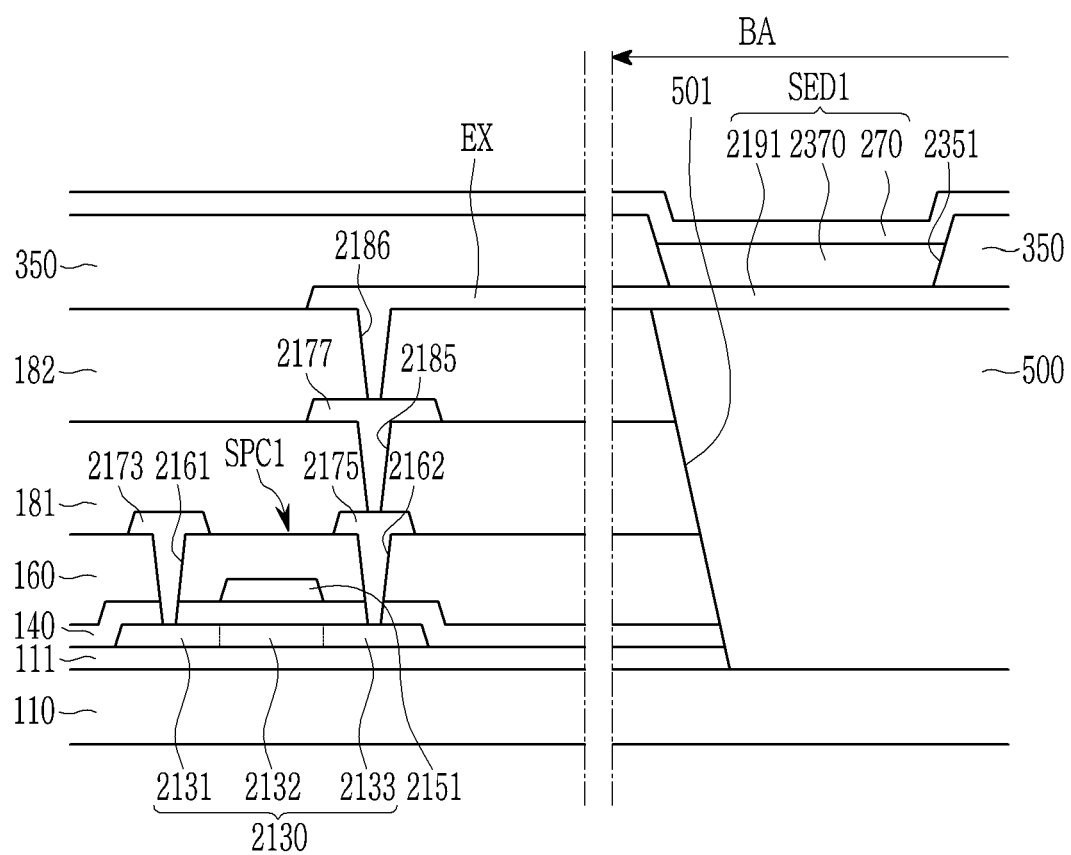
FIG. 11 illustrates a cross-sectional view of a predetermined region of a display device according to an embodiment.

FIG. 11 illustrates a cross-sectional view of a predetermined region of a display device according to an embodiment. FIG. 11 illustrates part of a sub-display area (SDA) including a bendable area (BA).

As illustrated in FIG. 11, the light emitting area of the first sub-light-emitting device SED1 of the display device according to an embodiment may not overlap the first sub-pixel circuit SPC1 connected to the first sub-light-emitting device SED1. The first sub-pixel circuit SPC1 may include a semiconductor 2130, a gate electrode 2151, a source electrode 2173, and a drain electrode 2175 positioned on the substrate 110. The first sub-light-emitting device SED1 may include a pixel electrode 2191, a light-emitting device layer 2370, and a common electrode 270.

An insulating layer made of an inorganic material such as a gate insulating layer 140 or an interlayer insulating layer 160 may be positioned among respective layers configuring the first sub-pixel circuit SPC1, and in general, the insulating layer may be entirely positioned on the substrate 110. The insulating layer may also be positioned in the bendable area (BA), and the insulating layer may be damaged during a process to perform bending. Regarding the display device according to an embodiment, the buffer layer 111, the gate insulating layer 140, the interlayer insulating layer 160, the first passivation layer 181, and the second passivation layer 182 positioned in the bendable area (BA) may be removed. That is, the buffer layer 111, the gate insulating layer 140, the interlayer insulating layer 160, the first passivation layer 181, and the second passivation layer 182 may include an opening 501, and the opening 501 may be positioned in the bendable area (BA). The opening 501 may entirely correspond to the bendable area (BA). However, without being limited thereto, the opening 501 may correspond to part of the bendable area (BA). For example, the opening 510 may correspond to the center of the bendable area (BA).

A bendable-portion pattern 500 may be positioned in the opening 501. A thickness of the bendable-portion pattern 500 may correspond to a sum of thicknesses of the buffer layer 111, the gate insulating layer 140, the interlayer insulating layer 160, the first passivation layer 181, and the second passivation layer 182. However, the thickness of the bendable-portion pattern 500 is not limited thereto, and it may be greater or lesser than the thicknesses of the buffer layer 111, the gate insulating layer 140, the interlayer insulating layer 160, the first passivation layer 181, and the second passivation layer 182. The bendable-portion pattern 500 may be made of an organic material. For example, the bendable-portion pattern 500 may be made of a polyimide. The material of the bendable-portion pattern 500 is not, however, limited thereto, and any materials that are advantageous for the bending characteristic are usable. Regarding the display device according to an embodiment, the bendable area (BA) may be prevented from being damaged during the process to perform bending by removing the inorganic insulating layer positioned in the bendable area (BA), and filling the portion from which the inorganic insulating layer is removed with a material that is advantageous for the bending.

It has been described in the above to form the opening 501 by removing the buffer layer 111, the gate insulating layer 140, the interlayer insulating layer 160, the first passivation layer 181, and the second passivation layer 182 positioned in the bendable area (BA), but it is not limited thereto. The opening 501 may be formed by removing some of the buffer layer 111, the gate insulating layer 140, the interlayer insulating layer 160, the first passivation layer 181, and the second passivation layer 182 positioned in the bendable area (BA), which will now be described with reference to FIG. 12.

Figure 12:
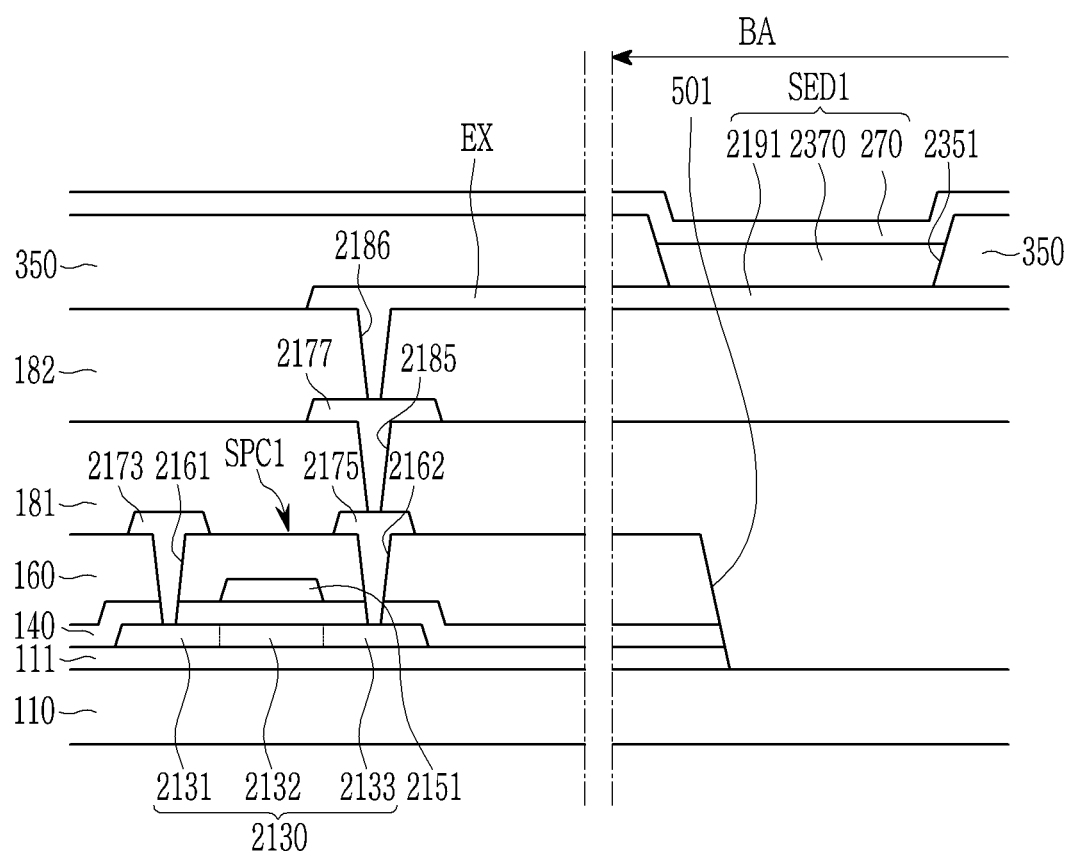
FIG. 12 illustrates a cross-sectional view of a predetermined region of a display device according to an embodiment.

FIG. 12 illustrates a cross-sectional view of a predetermined region of a display device according to an embodiment.

As illustrated in FIG. 12, the buffer layer 111, the gate insulating layer 140, and the interlayer insulating layer 160 positioned in the bendable area (BA) may be partially removed. That is, the buffer layer 111, the gate insulating layer 140, and the interlayer insulating layer 160 may include the opening 501, and the opening 501 may be positioned in the bendable area (BA).

A first passivation layer 181 is positioned on the interlayer insulating layer 160, and the first passivation layer 181 may fill the opening 501. A second passivation layer 182 may be positioned on the first passivation layer 181. The first passivation layer 181 and the second passivation layer 182 may be positioned in the bendable area (BA). The first passivation layer 181 and the second passivation layer 182 may be made of organic materials. Regarding the display device according to an embodiment, the bendable area (BA) may be prevented from being damaged during the process for performing bending by removing the predetermined insulating layer positioned in the bendable area (BA), and filling the portion from which the insulating layer is removed with a material that is advantageous for the bending.

A display device according to an embodiment will now be described with reference to FIG. 13.

The display device according to an embodiment described with reference to FIG. 13 mostly corresponds to the display device according to an embodiment described with reference to FIG. 8 to FIG. 12, so no same portions will be described. Embodiments include a sub-pixel circuit that is positioned on respective sides of the first driving circuit, which will now be described.

Figure 13:
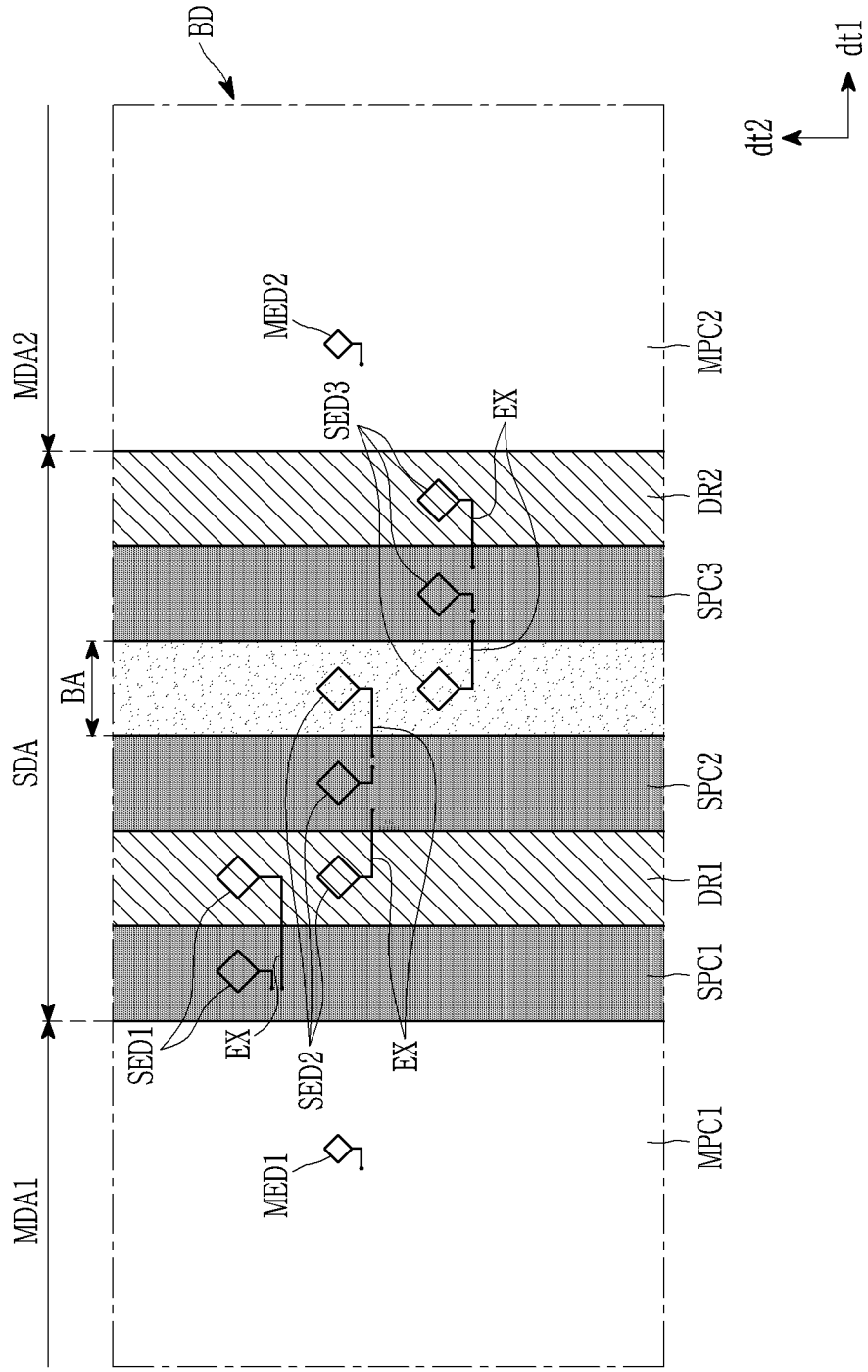
FIG. 13 illustrates a top plan view of a predetermined region of a display device according to an embodiment.

FIG. 13 illustrates a top plan view of a predetermined region of a display device according to an embodiment.

As illustrated in FIG. 13, the display device according to an embodiment includes a first main display area MDA1, a second main display area MDA2, and a sub-display area (SDA) positioned therebetween.

A first main pixel circuit MPC1 and a first main light-emitting device MED1 connected thereto may be positioned in the first main display area MDA1, and a second main pixel circuit MPC2 and a second main light-emitting device MED2 connected thereto may be positioned in the second main display area MDA2.

Sub-light-emitting devices SED1, SED2, and SED3 may be positioned in the sub-display area (SDA). The sub-light-emitting devices SED1, SED2, and SED3 may include a first sub-light-emitting device SED1 connected to the first sub-pixel circuit SPC1, a second sub-light-emitting device SED2 connected to the second sub-pixel circuit SPC2, and a third sub-light-emitting device SED3 connected to the third sub-pixel circuit SPC3.

The sub-display area (SDA) may include a bendable area (BA). A second sub-pixel circuit SPC2 and a third sub-pixel circuit SPC3 may be positioned on respective sides of the bendable area (BA). The second sub-pixel circuit SPC2 and the third sub-pixel circuit SPC3 may not overlap the bendable area (BA).

A first driving circuit DR1 may be positioned on one side of the second sub-pixel circuit SPC2. The second sub-pixel circuit SPC2 may not overlap the first driving circuit DR1. The second sub-pixel circuit SPC2 may be positioned between the first driving circuit DR1 and the bendable area (BA). The light emitting area of the second sub-light-emitting device SED2 connected to the second sub-pixel circuit SPC2 may overlap the first driving circuit DR1 or the bendable area (BA). For example, the second sub-light-emitting device SED2 connected to the second sub-pixel circuit SPC2 may extend to the left by the extension (EX) of the anode and may be positioned on the first driving circuit DR1. In another way, the second sub-light-emitting device SED2 connected to the second sub-pixel circuit SPC2 may extend to the right by the extension (EX) of the anode and may be positioned in the bendable area (BA). A predetermined light emitting area of the second sub-light-emitting device SED2 may overlap the second sub-pixel circuit SPC2 connected to the predetermined light emitting area thereof.

A first sub-pixel circuit SPC1 may be positioned on one side of the first driving circuit DR1. The first driving circuit DR1 may not overlap the first sub-pixel circuit SPC1. The first driving circuit DR1 may be positioned between the first sub-pixel circuit SPC1 and the second sub-pixel circuit SPC2. The light emitting area of the first sub-light-emitting device SED1 connected to the first sub-pixel circuit SPC1 may overlap the first driving circuit DR1. For example, the first sub-light-emitting device SED1 connected to the first sub-pixel circuit SPC1 may extend to the right by the extension (EX) of the anode and may be positioned on the first driving circuit DR1. A predetermined light emitting area of the first sub-light-emitting device SED1 may overlap the first sub-pixel circuit SPC1 connected to the predetermined light emitting area thereof.

A second driving circuit DR2 may be positioned on one side of the third sub-pixel circuit SPC3. The third sub-pixel circuit SPC3 may not overlap the second driving circuit DR2. The third sub-pixel circuit SPC3 may be positioned between the second driving circuit DR2 and the bendable area (BA). The light emitting area of the third sub-light-emitting device SED3 connected to the third sub-pixel circuit SPC3 may overlap the second driving circuit DR2 or the bendable area (BA). For example, the third sub-light-emitting device SED3 connected to the third sub-pixel circuit SPC3 may extend to the right by the extension (Ex) of the anode and may be positioned on the second driving circuit DR2. In another way, the third sub-light-emitting device SED3 connected to the third sub-pixel circuit SPC3 may extend to the left by the extension (Ex) of the anode and may be positioned in the bendable area (BA). A predetermined light emitting area of the third sub-light-emitting device SED3 may overlap the third sub-pixel circuit SPC3 connected to the predetermined light emitting area thereof.

Regarding the display device according to an embodiment, the sub-light-emitting devices SED1, SED2, and SED3 overlap the sub-pixel circuits SPC1, SPC2, and SPC3 respectively and also overlap the driving circuits DR1 and DR2 respectively. The sub-light emitting devices SED2 and SED3 overlap the bendable area (BA), thereby in combination with the other overlapped areas expand the screen displayed region. By positioning a plurality of driving circuits DR1 and DR2 in the sub-display area (SDA), the area of the peripheral area (PA) may be further reduced and the bezel area may be reduced. The screen may also be displayed in the bendable area (BA).

Regarding the display device according to an embodiment, the first sub-light-emitting device SED1 connected to the first sub-pixel circuit SPC1 is positioned on the first driving circuit DRA. The second sub-light-emitting device SED2 connected to the second sub-pixel circuit SPC2 is also positioned on the first driving circuit DR1. Both sets of connections improve the resolution of the sub-display area (SDA). The second sub-light-emitting device SED2 and the third sub-light-emitting device SED3 respectively connected to the second sub-pixel circuit SPC2 and the third sub-pixel circuit SPC3 are positioned in the bendable area (BA), thereby improving resolution of the sub-display area (SDA).

A display device according to an embodiment will now be described with reference to FIG. 14.

The display device according to an embodiment described with reference to FIG. 14 mostly corresponds to the display device according to an embodiment described with reference to FIG. 13, so no same portions will be described. A sub-pixel circuit is positioned on respective sides of the second driving circuit, which will now be described.

Figure 14:
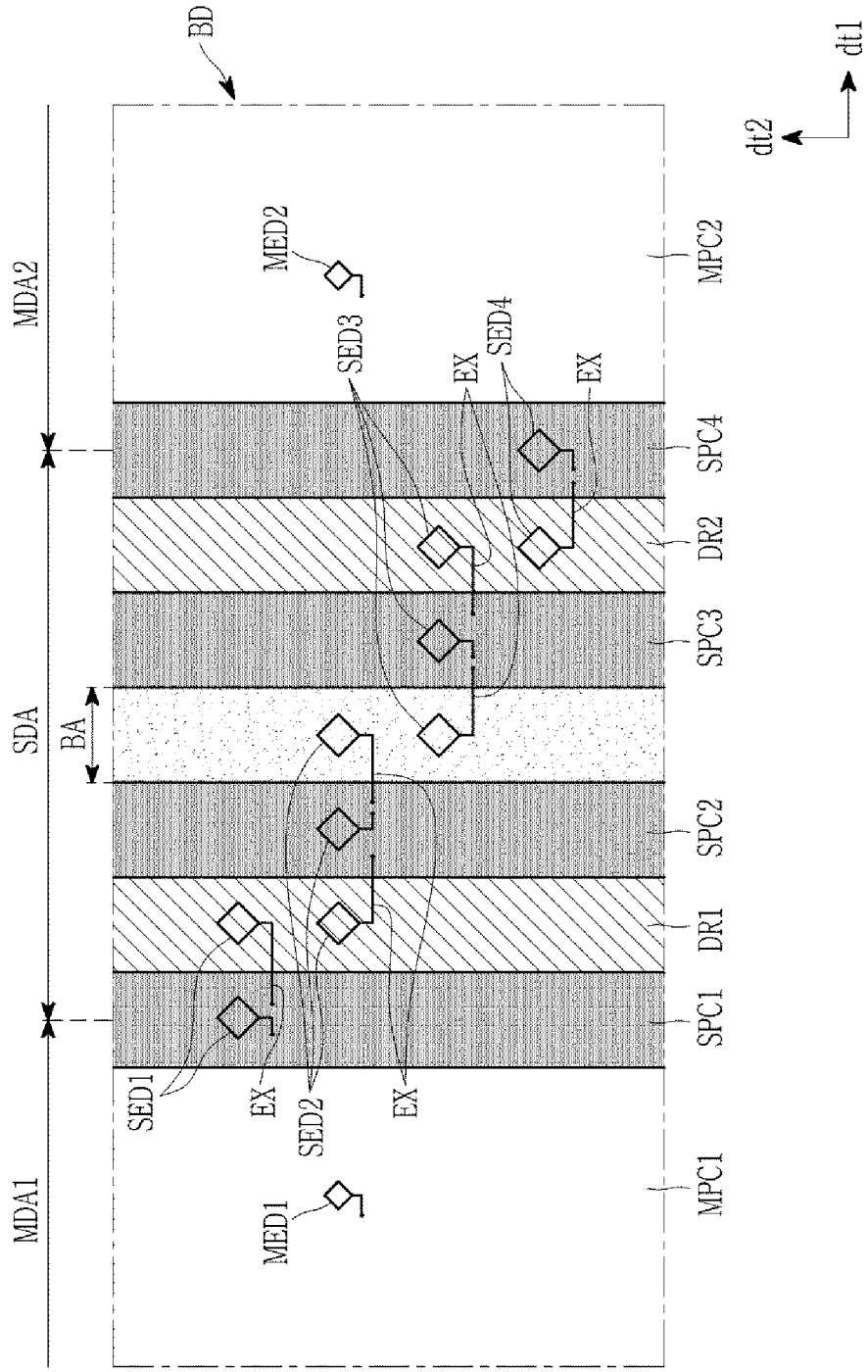
FIG. 14 illustrates a top plan view of a predetermined region of a display device according to an embodiment.

FIG. 14 illustrates a top plan view of a predetermined region of a display device according to an embodiment.

As illustrated in FIG. 14, the display device according to an embodiment includes a first main display area MDA1, a second main display area MDA2, and a sub-display area (SDA) positioned therebetween.

In the previous embodiment, a first sub-pixel circuit SPC1 and a second sub-pixel circuit SPC2 may be positioned on respective sides of the first driving circuit DR1, a second sub-pixel circuit SPC2 and a third sub-pixel circuit SPC3 may be positioned on respective sides of the bendable area (BA), and a third sub-pixel circuit SPC3 may be positioned on one side of the second driving circuit DR2. In the present embodiment, the first sub-pixel circuit SPC1 and the second sub-pixel circuit SPC2 may be respectively positioned on respective sides of the first driving circuit DR1, the second sub-pixel circuit SPC2 and the third sub-pixel circuit SPC3 may be respectively positioned on respective sides of the bendable area (BA), and the third sub-pixel circuit SPC3 and the fourth sub-pixel circuit SPC4 may be respectively positioned on respective sides of the second driving circuit DR2. That is, regarding the display device according to the present embodiment, the sub-pixel circuits (SPC1, SPC2, SPC3, and SPC4) may further include a fourth sub-pixel circuit SPC4.

As illustrated in FIG. 14, the first sub-pixel circuit SPC1 may straddle the first main display area MDA1 and the sub-display area SDA. The fourth sub-pixel circuit SPC4 may likewise straddle the sub-display area SDA and the second main display area MDA2. By positioning more sub-pixel circuit areas within the sub-display area, the area of the peripheral area (PA) may be further reduced and the bezel area may be reduced. The screen may also be displayed in the bendable area (BA).

The fourth sub-pixel circuit SPC4 may not overlap the second driving circuit DR2. The light emitting area of the fourth sub-light-emitting device SED4 connected to the fourth sub-pixel circuit SPC4 may overlap the second driving circuit DR2. For example, the fourth sub-light-emitting device SED4 connected to the fourth sub-pixel circuit SPC4 may extend to the left by the extension (EX) of the anode and may be positioned on the second driving circuit DR2. A predetermined light emitting area of the fourth sub-light-emitting device SED4 may overlap the fourth sub-pixel circuit SPC4 connected to the predetermined light emitting area thereof.

In the display device according to an embodiment, the sub-light-emitting devices (SED1, SED2, SED3, and SED4) overlap the sub-pixel circuits (SPC1, SPC2, SPC3, and SPC4) and also overlap the driving circuits DR1 and DR2 and the bendable area (BA), thereby expanding the screen displayed region. By positioning a plurality of driving circuits DR1 and DR2 in the sub-display area (SDA), the area of the peripheral area (PA) may be further reduced and the bezel may be reduced. The screen may also be displayed in the bendable area (BA).

In the display device according to an embodiment, the first sub-light-emitting device SED1 and the second sub-light-emitting device SED2 respectively connected to the first sub-pixel circuit SPC1 and the second sub-pixel circuit SPC2 may be positioned on the first driving circuit DR1, thereby improving resolution of the sub-display area (SDA). The second sub-light-emitting device SED2 and the third sub-light-emitting device SED3 respectively connected to the second sub-pixel circuit SPC2 and the third sub-pixel circuit SPC3 may be positioned in the bendable area (BA), thereby improving resolution of the sub-display area (SDA). The third sub-light-emitting device SED3 and the fourth sub-light-emitting device SED4 respectively connected to the third sub-pixel circuit SPC3 and the fourth sub-pixel circuit SPC4 may be positioned on the second driving circuit DR2, thereby improving resolution of the sub-display area (SDA).

A display device according to an embodiment will now be described with reference to FIG. 15.

The display device according to an embodiment described with reference to FIG. 15 mostly corresponds to the display device according to an embodiment described with reference to FIG. 8 to FIG. 12, so no same portions will be described. Positions of the first sub-pixel circuit and the second sub-pixel circuit according to the present embodiment will now be described.

Figure 15:
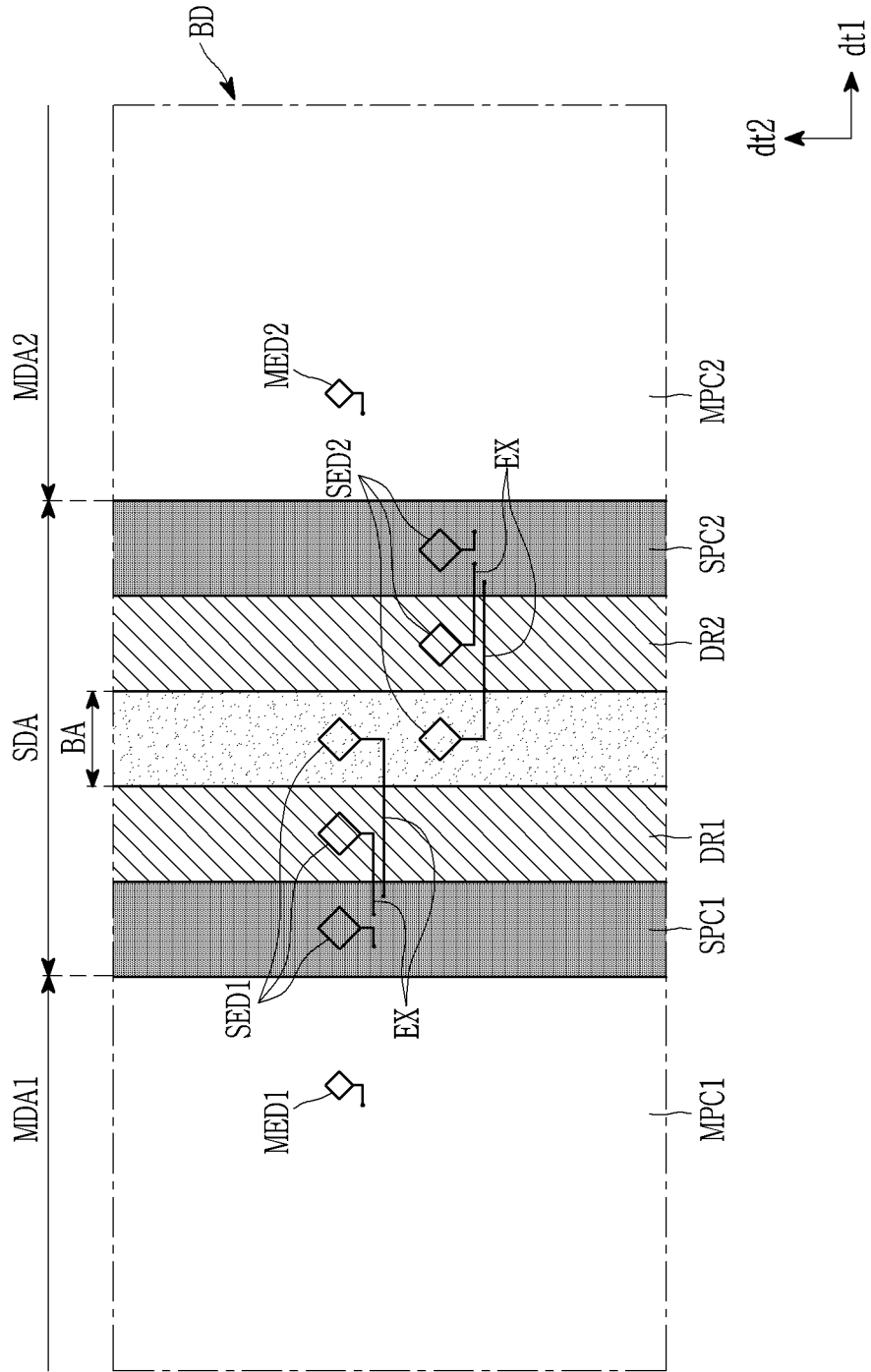
FIG. 15 illustrates a top plan view of a predetermined region of a display device according to an embodiment.

FIG. 15 illustrates a top plan view of a predetermined region of a display device according to an embodiment.

As illustrated in FIG. 15, the display device according to an embodiment includes a first main display area MDA1, a second main display area MDA2, and a sub-display area (SDA) positioned therebetween.

A first main pixel circuit MPC1 and a first main light-emitting device MED1 connected thereto may be positioned in the first main display area MDA1, and a second main pixel circuit MPC2 and a second main light-emitting device MED2 connected thereto may be positioned in the second main display area MDA2.

Sub-light-emitting devices SED1 and SED2 may be positioned in the sub-display area (SDA). The sub-light-emitting devices SED1 and SED2 may include a first sub-light-emitting device SED1 connected to the first sub-pixel circuit SPC1 and a second sub-light-emitting device SED2 connected to the second sub-pixel circuit SPC2.

The sub-display area (SDA) may include a bendable area (BA). A first driving circuit DR1 and a second driving circuit DR2 may be respectively positioned on respective sides of the bendable area (BA). The bendable area (BA) may not overlap the first driving circuit DR1 and the second driving circuit DR2.

A first sub-pixel circuit SPC1 may be positioned on one side of the first driving circuit DR1. The first driving circuit DR1 may not overlap the first sub-pixel circuit SPC1. The first driving circuit DR1 may be positioned between the first sub-pixel circuit SPC1 and the bendable area (BA). The light emitting area of the first sub-light-emitting device SED1 connected to the first sub-pixel circuit SPC1 may overlap the first driving circuit DR1 or the bendable area (BA). For example, the first sub-light-emitting device SED1 connected to the first sub-pixel circuit SPC1 may extend to the right by the extension (EX) of the anode from the first sub-pixel circuit SPC1 to the bendable area (BA) and may be positioned on the first driving circuit DR1 or in the bendable area (BA). The extension (EX) extending up to the bendable area (BA) may be longer than the extension (EX) extending up to the first driving circuit DR1. A predetermined light emitting area of the first sub-light-emitting device SED1 may overlap the first sub-pixel circuit SPC1 connected to the predetermined light emitting area thereof.

A second sub-pixel circuit SPC2 may be positioned on the second driving circuit DR2. The second driving circuit DR2 may not overlap the second sub-pixel circuit SPC2. The second driving circuit DR2 may be positioned between the second sub-pixel circuit SPC2 and the bendable area (BA). The light emitting area of the second sub-light-emitting device SED2 connected to the second sub-pixel circuit SPC2 may overlap the second driving circuit DR2 or the bendable area (BA). For example, the second sub-light-emitting device SED2 connected to the second sub-pixel circuit SPC2 may extend to the left by the extension (EX) of the anode and may be positioned on the second driving circuit DR2 or in the bendable area (BA). The extension (EX) extending to the bendable area (BA) may be longer than the extension (EX) extending to the second driving circuit DR2. A predetermined light emitting area of the second sub-light-emitting device SED2 may overlap the second sub-pixel circuit SPC2 connected to the predetermined light emitting area thereof.

Regarding the display device according to an embodiment, the sub-light-emitting devices SED1 and SED2 overlap the sub-pixel circuits (SPC1 and SPC2) and also overlap the driving circuits DR1 and DR2 and the bendable area (BA), thereby expanding the screen displayed region. By positioning a plurality of driving circuits DR1 and DR2 in the sub-display area (SDA), the area of the peripheral area (PA) may be further reduced and the bezel may be reduced. The screen may also be displayed in the bendable area (BA).

A display device according to an embodiment will now be described with reference to FIG. 16.

The display device according to an embodiment described with reference to FIG. 16 mostly corresponds to the display device according to an embodiment described with reference to FIG. 15, so no same portions will be described. The present embodiment further includes a third driving circuit, and the bendable area includes a first bendable area and a second bendable area, which will be described.

Figure 16:
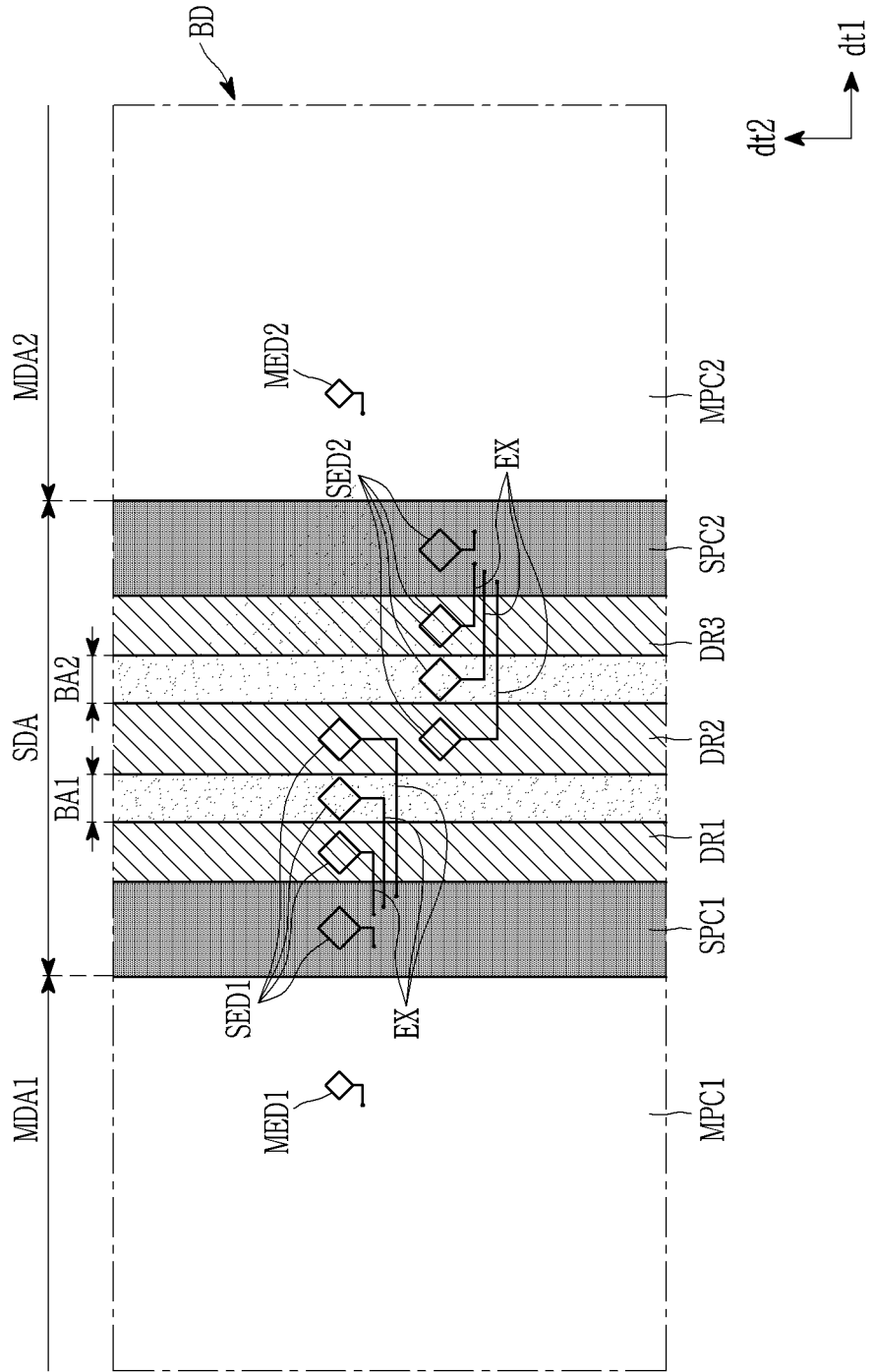
FIG. 16 illustrates a top plan view of a predetermined region of a display device according to an embodiment.

FIG. 16 illustrates a top plan view of a predetermined region of a display device according to an embodiment.

As illustrated in FIG. 16, the display device according to an embodiment includes a first main display area MDA1, a second main display area MDA2, and a sub-display area (SDA) positioned therebetween.

In the previous embodiment, the display device may include one bendable area, and in the present embodiment, the display device may include a plurality of bendable areas. The display device according to an embodiment may include a first bendable area BA1 and a second bendable area BA2.

In the present embodiment, the driving circuits DR1, DR2, and DR3 may include a first driving circuit DR1, a second driving circuit DR2, and a third driving circuit DR3. A first driving circuit DR1 and a second driving circuit DR2 may respectively be positioned on respective sides of the first bendable area BA1. A second driving circuit DR2 and a third driving circuit DR3 may respectively be positioned on respective sides of the second bendable area BA2. The first driving circuit DR1, the first bendable area BA1, the second driving circuit DR2, the second bendable area BA2, and the third driving circuit DR3 may not overlap each other.

A first sub-pixel circuit SPC1 may be positioned on one side of the first driving circuit DR1. The first driving circuit DR1 may not overlap the first sub-pixel circuit SPC1. The first driving circuit DR1 may be positioned between the first sub-pixel circuit SPC1 and the first bendable area BA1. The light emitting area of the first sub-light-emitting device SED1 connected to the first sub-pixel circuit SPC1 may overlap the first driving circuit DR1, the first bendable area BA1, or the second driving circuit DR2. For example, the first sub-light-emitting device SED1 connected to the first sub-pixel circuit SPC1 may extend to the right from the first sub-pixel circuit SPC1 by the extension (EX) of the anode and may be positioned on the first driving circuit DR1 in the first bendable area BA1, or partially on the second driving circuit DR2. In this instance, the extension (EX) extending up to the second driving circuit DR2 may be longer than the extension (EX) extending up to the first bendable area BA1, and the extension (EX) extending up to the first bendable area BA1 may be longer than the extension (EX) extending up to the first driving circuit DR1. A predetermined light emitting area of the first sub-light-emitting device SED1 may overlap the first sub-pixel circuit SPC1 connected to the predetermined light emitting area thereof.

The second driving circuit DR2 may be positioned between the first bendable area BA1 and the second bendable area BA2.

A second sub-pixel circuit SPC2 may be positioned on one side of the third driving circuit DR3. The third driving circuit DR3 may not overlap the second sub-pixel circuit SPC2. The third driving circuit DR3 may be positioned between the second sub-pixel circuit SPC2 and the second bendable area BA2. The light emitting area of the second sub-light-emitting device SED2 connected to the second sub-pixel circuit SPC2 may overlap the second driving circuit DR2, the second bendable area BA2, or the third driving circuit DR3. For example, the second sub-light-emitting device SED2 connected to the second sub-pixel circuit SPC2 may extend to the left by the extension (Ex) of the anode and may be positioned on the second driving circuit DR2, in the bendable area (BA), or on the third driving circuit DR3. The extension (Ex) extending up to the second driving circuit DR2 may be longer than the extension (Ex) extending up to the bendable area (BA), and the extension (Ex) extending up to the bendable area (BA) may be longer than the extension (Ex) extending up to the third driving circuit DR3. A predetermined light emitting area of the second sub-light-emitting device SED2 may overlap the second sub-pixel circuit SPC2 connected to the predetermined light emitting area thereof.

A display device according to an embodiment will now be described with reference to FIG. 17.

The display device according to an embodiment described with reference to FIG. 17 mostly corresponds to the display device according to an embodiment described with reference to FIG. 8 to FIG. 12, so no same portions will be described. A bending axis of the bendable area according to the present embodiment is different from that according to the previous embodiment, which will now be described.

Figure 17:
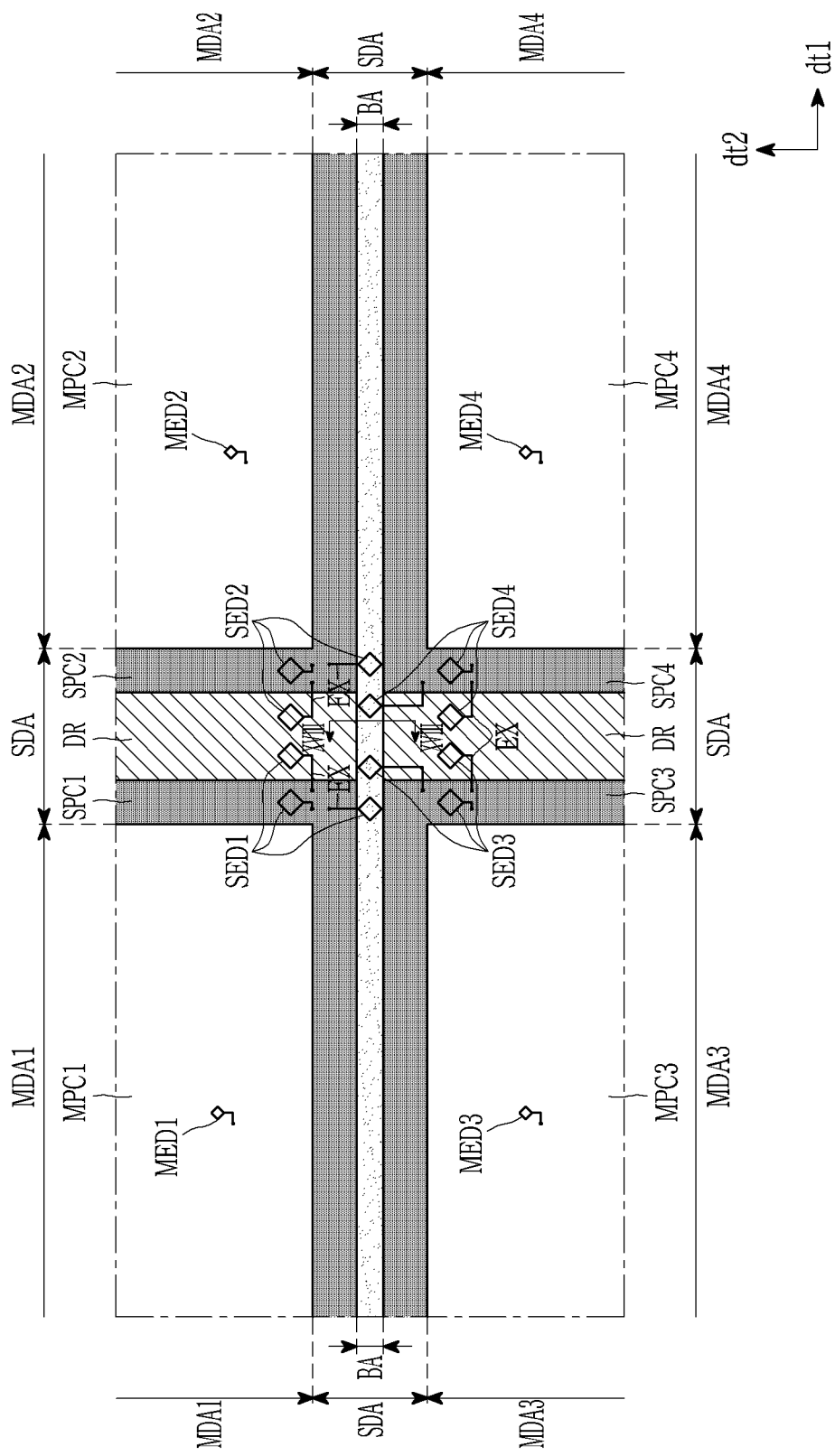
FIG. 17 illustrates a top plan view of a predetermined region of a display device according to an embodiment.

FIG. 17 illustrates a top plan view of a predetermined region of a display device according to an embodiment.

As illustrated in FIG. 17, the display device according to an embodiment includes a first main display area MDA1, a second main display area MDA2, a third main display area MDA3, a fourth main display area MDA4, and a sub-display area (SDA) positioned among them.

In the previous embodiment, the sub-display area (SDA) may have a bar shape lengthily extending in the second direction dt2, and the first main display area MDA1 and the second main display area MDA2 may be positioned on respective sides of the sub-display area (SDA). In the present embodiment, the sub-display area (SDA) may have a cross shape lengthily extending in the first direction dt1 and the second direction dt2, and the first main display area MDA1, the second main display area MDA2, the third main display area MDA3, and the fourth main display area MDA4 may be positioned on the top, bottom, right, and left of the sub-display areas (SDA).

A first main pixel circuit MPC1 and a first main light-emitting device MED1 connected thereto may be positioned in the first main display area MDA1, and a second main pixel circuit MPC2 and a second main light-emitting device MED2 connected thereto may be positioned in the second main display area MDA2. A third main pixel circuit MPC3 and a third main light-emitting device MED3 connected thereto may be positioned in the third main display area MDA3, and a fourth main pixel circuit MPC4 and a fourth main light-emitting device MED4 connected thereto may be positioned in the fourth main display area MDA4.

Sub-light-emitting devices (SED1, SED2, SED3, and SED4) may be positioned in the sub-display area (SDA). The sub-light-emitting devices (SED1, SED2, SED3, and SED4) may include a first sub-light-emitting device SED1 connected to the first sub-pixel circuit SPC1, a second sub-light-emitting device SED2 connected to the second sub-pixel circuit SPC2, a third sub-light-emitting device SED3 connected to the third sub-pixel circuit SPC3, and a fourth sub-light-emitting device SED4 connected to the fourth sub-pixel circuit SPC4.

The display device according to an embodiment may include a driving circuit (DR). The display device may be bent and may include a bendable area (BA). Portions of the first sub-light-emitting device SED1, second sub-light-emitting device SED2, third sub-light-emitting device SED3, and fourth sub-light-emitting device SED2, may be disposed in the bendable area (BA). In the previous embodiment, the driving circuit may have a bar shape lengthily extending in parallel to the bending axis. In the present embodiment, the driving circuit (DR) may have a bar shape lengthily extending in a different direction from the bending axis in the bendable area (BA). For example, the bending axis may be parallel to the first direction (dt1), and the driving circuit (DR) may have a bar shape lengthily extending in the second direction dt2 that is different from the first direction dt1. The bendable area (BA) may have a bar shape lengthily extending in the first direction dt1. The first direction dt1 and the second direction dt2 may be perpendicular to each other. Hence, the bendable area (BA) may orthogonally cross the driving circuit (DR).

The main display areas (MDA1, MDA2, MDA3, and MDA4) may be divided into four portions with respect to the the crossing part of the bendable area (BA) and the driving circuit (DR). The first main display area MDA1 may be positioned on a top left of the crossing part, and the second main display area MDA2 may be positioned on a top right of the crossing part. The third main display area MDA3 may be position on a bottom left of the crossing part, and the fourth main display area MDA4 may be positioned on a bottom right of the crossing part.

The first sub-pixel circuit SPC1 may be positioned between the driving circuit (DR) and the first main display area MDA1, and may be positioned between the bendable area (BA) and the first main display area MDA1. The light emitting area of the first sub-light-emitting device SED1 connected to the first sub-pixel circuit SPC1 may overlap the driving circuit (DR) or the bendable area (BA). For example, the first sub-light-emitting device SED1 connected to the first sub-pixel circuit SPC1 may extend to the right or the left by the extension (Ex) of the anode, and may be positioned on the driving circuit (DR) or in the bendable area (BA). A predetermined light emitting area of the first sub-lightemitting device SED1 may overlap the first sub-pixel circuit SPC1 connected to the predetermined light emitting area thereof.

The second sub-pixel circuit SPC2 may be positioned between the driving circuit (DR) and the second main display area MDA2, and between the bendable area (BA) and the second main display area MDA2. The light emitting area of the second sub-light-emitting device SED2 connected to the second sub-pixel circuit SPC2 may overlap the driving circuit (DR) or the bendable area (BA). For example, the second sub-light-emitting device SED2 connected to the second sub-pixel circuit SPC2 may extend to the left or the right by the extension (Ex) of the anode, and may be positioned on the driving circuit (DR) or in the bendable area (BA). A predetermined light emitting area of the second sub-light-emitting device SED2 may overlap the second sub-pixel circuit SPC2 connected to the predetermined light emitting area thereof.

The third sub-pixel circuit SPC3 may be positioned between the driving circuit (DR) and the third main display area MDA3 and between the bendable area (BA) and the third main display area MDA3. The light emitting area of the third sub-light-emitting device SED3 connected to the third sub-pixel circuit SPC3 may overlap the driving circuit (DR) or the bendable area (BA). For example, the third sub-light-emitting device SED3 connected to the third sub-pixel circuit SPC3 may extend to the right or the left by the extension (Ex) of the anode, and may be positioned on the driving circuit (DR) or in the bendable area (BA). A predetermined light emitting area of the third sub-light-emitting device SED3 may overlap the third sub-pixel circuit SPC3 connected to the predetermined light emitting area thereof.

The fourth sub-pixel circuit SPC4 may be positioned between the driving circuit (DR) and the fourth main display area MDA4, and between the bendable area (BA) and the fourth main display area MDA4. The light emitting area of the fourth sub-light-emitting device SED4 connected to the fourth sub-pixel circuit SPC4 may overlap the driving circuit (DR) or the bendable area (BA). For example, the fourth sub-light-emitting device SED4 connected to the fourth sub-pixel circuit SPC4 may extend to the left or the upper side by the extension (Ex) of the anode, and may be positioned on the driving circuit (DR) or in the bendable area (BA). A predetermined light emitting area of the fourth sub-light-emitting device SED4 may overlap the fourth sub-pixel circuit SPC4 connected to the predetermined light emitting area thereof.

In the display device according to an embodiment, the sub-light-emitting devices (SED1, SED2, SED3, and SED4) overlap the sub-pixel circuits (SPC1, SPC2, SPC3, and SPC4) and also overlap the driving circuit (DR) and the bendable area (BA), thereby expanding the screen displayed region.

Regarding the display device according to an embodiment, the first sub-light-emitting device SED1, the second sub-light-emitting device SED2, the third sub-light-emitting device SED3, and the fourth sub-light-emitting device SED4 respectively connected to the first sub-pixel circuit SPC1, the second sub-pixel circuit SPC2, the third sub-pixel circuit SPC3, and the fourth sub-pixel circuit SPC4 are positioned on the driving circuit (DR) or in the bendable area (BA), thereby improving resolution of the sub-display area (SDA).

A connection configuration of wires of the driving circuit (DR) positioned on respective sides of the bendable area (BA) will now be described with reference to FIG. 18.

Figure 18:
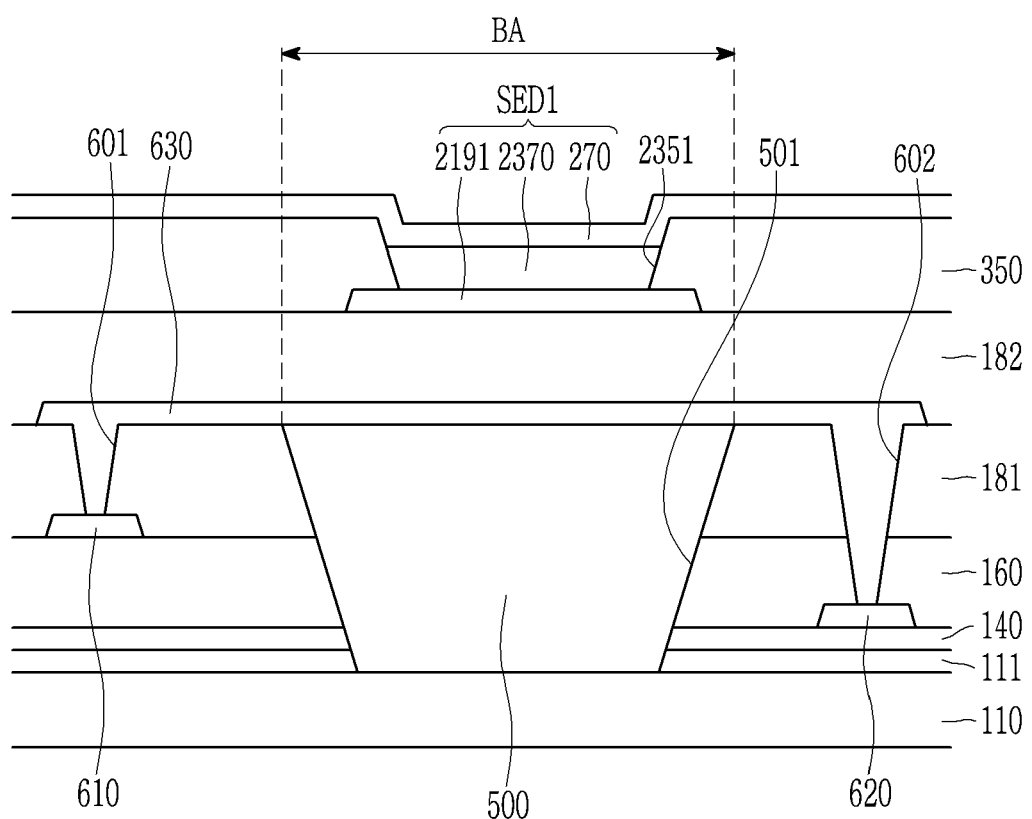
FIG. 18 illustrates a cross-sectional view of a predetermined region of a display device according to an embodiment.

FIG. 18 illustrates a cross-sectional view of a predetermined region of a display device according to an embodiment. FIG. 18 illustrates part of the sub-display area (SDA) including the bendable area (BA).

As illustrated in FIG. 18, a first wire 610 and a second wire 620 of the driving circuit (DR) may be positioned on respective sides of the bendable area (BA). The first wire 610 of the driving circuit (DR) may be positioned on the interlayer insulating layer 160, and may be made of a first data conductive layer. The second wire 620 of the driving circuit (DR) may be positioned on the gate insulating layer 140, and may be made of a gate conductive layer. This is, however, an example, and the first wire 610 and the second wire 620 may be positioned on different layers.

The buffer layer 111, the gate insulating layer 140, the interlayer insulating layer 160, and the first passivation layer 181 positioned in the bendable area (BA) may be removed. That is, the buffer layer 111, the gate insulating layer 140, the interlayer insulating layer 160, and the first passivation layer 181 may include an opening 501, and the opening 501 may be positioned in the bendable area (BA). Therefore, the semiconductor layer, the gate conductive layer, and the first data conductive layer may not be positioned in the bendable area (BA). A bendable-portion pattern 500 may be positioned in the opening 501.

A connection electrode 630 may be positioned on the first passivation layer 181 and the bendable-portion pattern 500. The connection electrode 630 may be positioned on the second data conductive layer. The first passivation layer 181 may include an opening 601 overlapping the first wire 610 and the connection electrode 630. The connection electrode 630 may be connected to the first wire 610 through the opening 601. The first passivation layer 181 may include an opening 602 overlapping the second wire 620 and the connection electrode 630. The connection electrode 630 may be connected to the second wire 620 through the opening 602. The first wire 610 and the second wire 620 of the driving circuit (DR) may be connected to each other by the connection electrode 630.

Regarding the display device according to an embodiment, the bendable area (BA) may be prevented from being damaged during the process to perform bending by removing the predetermined insulating layer positioned in the bendable area (BA), and filling the portion from which the insulating layer is removed with a material that is advantageous for the bending. By forming the connection electrode 630 on the bendable-portion pattern 500, the driving circuits (DR) positioned on respective sides with respect to the bendable area (BA) may be connected to each other.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate including a first main display area, a second main display area, and a sub-display area positioned between the first main display area and the second main display area;
a first driving circuit positioned on the sub-display area of the substrate;
a first sub-pixel circuit and a second sub-pixel circuit positioned on respective sides of the first driving circuit on the sub-display area of the substrate;

a first sub-light-emitting device connected to the first sub-pixel circuit and overlapping the first driving circuit; and a second sub-light-emitting device connected to the second sub-pixel circuit and overlapping the first driving circuit.

2. The display device of claim 1, wherein
the first sub-pixel circuit is positioned between the first driving circuit and the first main display area, and
the second sub-pixel circuit is positioned between the first driving circuit and the second main display area.

3. The display device of claim 2, further comprising
a second driving circuit and a third driving circuit positioned on the sub-display area of the substrate,
wherein the first sub-pixel circuit is positioned between the first driving circuit and the second driving circuit, and
the second sub-pixel circuit is positioned between the first driving circuit and the third driving circuit.

4. The display device of claim 3, wherein
the first sub-light-emitting device overlaps the first driving circuit or the second driving circuit, and
the second sub-light-emitting device overlaps the first driving circuit or the third driving circuit.

5. The display device of claim 1, wherein
the substrate further includes a bendable area, the bendable area is included in the sub-display area, and
the second sub-light-emitting device overlaps the first driving circuit or the bendable area.

6. The display device of claim 5, further comprising:
a third sub-pixel circuit and a second driving circuit positioned on the sub-display area of the substrate; and
a third sub-light-emitting device connected to the third sub-pixel circuit and overlapping the bendable area or the second driving circuit,
wherein the second sub-pixel circuit and the third sub-pixel circuit are positioned on respective sides of the bendable area, and
the third sub-pixel circuit is positioned between the bendable area and the second driving circuit.

7. The display device of claim 6, further comprising:
an insulating layer positioned among a plurality of layers configuring the first driving circuit, the first sub-pixel circuit, and the second sub-pixel circuit and including an opening; and
a bendable-portion pattern positioned in the opening,
wherein the opening overlaps the bendable area.

8. The display device of claim 6, further comprising:
a fourth sub-pixel circuit positioned on the sub-display area of the substrate; and
a fourth sub-light-emitting device connected to the fourth sub-pixel circuit and overlapping the second driving circuit,
wherein the second driving circuit is positioned between the third sub-pixel circuit and the fourth sub-pixel circuit.

9. The display device of claim 5, wherein
the first driving circuit lengthily extends in a first direction, and
the bendable area lengthily extends in a second direction traversing the first direction.

10. The display device of claim 9, further comprising:
a third sub-pixel circuit and a fourth sub-pixel circuit positioned on respective sides of the first driving circuit on the sub-display area of the substrate;

a third sub-light-emitting device connected to the third sub-pixel circuit and overlapping the first driving circuit or the bendable area; and
a fourth sub-light-emitting device connected to the fourth sub-pixel circuit and overlapping the first driving circuit or the bendable area,
wherein the bendable area is positioned between the first sub-pixel circuit and the third sub-pixel circuit and between the second sub-pixel circuit and the fourth sub-pixel circuit, and
the first sub-light-emitting device and the second sub-light-emitting device overlap the first driving circuit or the bendable area.

11. The display device of claim 1, further comprising:
a first main pixel circuit positioned on the first main display area of the substrate;
a first main light-emitting device connected to the first main pixel circuit and overlapping the first main pixel circuit;
a second main pixel circuit positioned on the second main display area of the substrate; and
a second main light-emitting device connected to the second main pixel circuit and overlapping the second main pixel circuit.

12. A display device comprising:
a substrate including a first main display area, a second main display area, and a sub-display area positioned between the first main display area and the second main display area and including a bendable area;
a first driving circuit positioned on the sub-display area of the substrate;
a first sub-pixel circuit positioned between the first driving circuit and the bendable area; and
a first sub-light-emitting device connected to the first sub-pixel circuit and overlapping the first driving circuit or the bendable area.

13. The display device of claim 12, further comprising:
a second driving circuit positioned on the sub-display area of the substrate;
a second sub-pixel circuit positioned between the second driving circuit and the bendable area; and
a second sub-light-emitting device not connected to the second sub-pixel circuit and overlapping the second driving circuit or the bendable area.

14. The display device of claim 13, further comprising:
a third sub-pixel circuit positioned between the first driving circuit and the first main display area; and
a third sub-light-emitting device connected to the third sub-pixel circuit and overlapping the first driving circuit.

15. The display device of claim 14, further comprising:
a fourth sub-pixel circuit positioned between the second driving circuit and the second main display area; and
a fourth sub-light-emitting device connected to the fourth sub-pixel circuit and overlapping the second driving circuit.

16. The display device of claim 12, further comprising:
an insulating layer positioned among a plurality of layers for configuring the first driving circuit and the first sub-pixel circuit, and including an opening; and
a bendable-portion pattern positioned in the opening,
wherein the opening overlaps the bendable area.

17. The display device of claim 16, wherein
the insulating layer includes an inorganic insulating material, and
the bendable-portion pattern includes an organic material.

18. A display device comprising:
a substrate including a first main display area, a second main display area, and a sub-display area positioned between the first main display area and the second main display area and including a first bendable area;
a first driving circuit positioned on the sub-display area of the substrate;
a first sub-pixel circuit positioned on the sub-display area of the substrate; and
a first sub-light-emitting device connected to the first sub-pixel circuit and overlapping the first driving circuit or the first bendable area,
wherein the first driving circuit is positioned between the first sub-pixel circuit and the first bendable area.

19. The display device of claim 18, further comprising:
a second driving circuit positioned on the sub-display area of the substrate;
a second sub-pixel circuit positioned on the sub-display area of the substrate; and
a second sub-light-emitting device connected to the second sub-pixel circuit and overlapping the second driving circuit or the first bendable area,
wherein the second driving circuit is positioned between the second sub-pixel circuit and the first bendable area.

20. The display device of claim 18, further comprising:
a second driving circuit and a third driving circuit positioned on the sub-display area of the substrate;
a second sub-pixel circuit positioned on the sub-display area of the substrate; and
a second sub-light-emitting device connected to the second sub-pixel circuit,
wherein the sub-display area further includes a second bendable area,
the second driving circuit is positioned between the first bendable area and the second bendable area,
the third driving circuit is positioned between the second bendable area and the second sub-pixel circuit,
the first sub-light-emitting device overlaps at least one of the first driving circuit, the first bendable area, and the second driving circuit, and
the second sub-light-emitting device overlaps at least one of the second driving circuit, the second bendable area, and the third driving circuit.

\* \* \* \* \*